United States Patent
Chiu

(10) Patent No.: US 11,621,225 B2
(45) Date of Patent: Apr. 4, 2023

(54) ELECTRICAL FUSE MATRIX

(71) Applicant: NANYA TECHNOLOGY CORPORATION, New Taipei (TW)

(72) Inventor: Hsih-Yang Chiu, Taoyuan (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 0 days.

(21) Appl. No.: 17/013,644

(22) Filed: Sep. 6, 2020

(65) Prior Publication Data
US 2022/0077057 A1    Mar. 10, 2022

(51) Int. Cl.
*H01L 23/525* (2006.01)
*H01L 27/08* (2006.01)
*H01L 21/02* (2006.01)

(52) U.S. Cl.
CPC .... *H01L 23/5252* (2013.01); *H01L 21/02255* (2013.01); *H01L 27/0802* (2013.01)

(58) Field of Classification Search
CPC ........... H01L 23/5252; H01L 27/11206; H01L 27/0802; H01L 45/1233; H01L 45/1246; H01L 21/0223–02258
See application file for complete search history.

(56) References Cited

U.S. PATENT DOCUMENTS

| | | | | |
|---|---|---|---|---|
| 5,463,244 A | * | 10/1995 | De Araujo | H01L 23/5252 257/15 |
| 6,927,474 B1 | * | 8/2005 | O'Connell | G11C 17/16 257/532 |
| 2010/0110746 A1 | * | 5/2010 | Hutchinson | G11C 11/16 257/E21.159 |
| 2011/0220861 A1 | * | 9/2011 | Himeno | H01L 27/1021 257/E47.001 |
| 2013/0105757 A1 | * | 5/2013 | Park | H01L 45/126 257/E45.001 |
| 2015/0076438 A1 | * | 3/2015 | Cho | H01L 27/101 257/4 |

* cited by examiner

*Primary Examiner* — Aaron J Gray
(74) *Attorney, Agent, or Firm* — CKC & Partners Co., LLC

(57) ABSTRACT

An electrical fuse matrix includes a plurality of anti-fuse structures, a plurality of top metal plates, and a plurality of bottom metal plates. The anti-fuse structures are arranged in a matrix, and each of the anti-fuse structure includes a top conductive structure, a bottom conductive structure, and a dielectric film disposed between the top conductive structure and the bottom conductive structure. The anti-fuse structure has an hourglass shape. The top metal plates are disposed on the top conductive structures. The bottom metal plates are disposed on the bottom conductive structures.

8 Claims, 33 Drawing Sheets

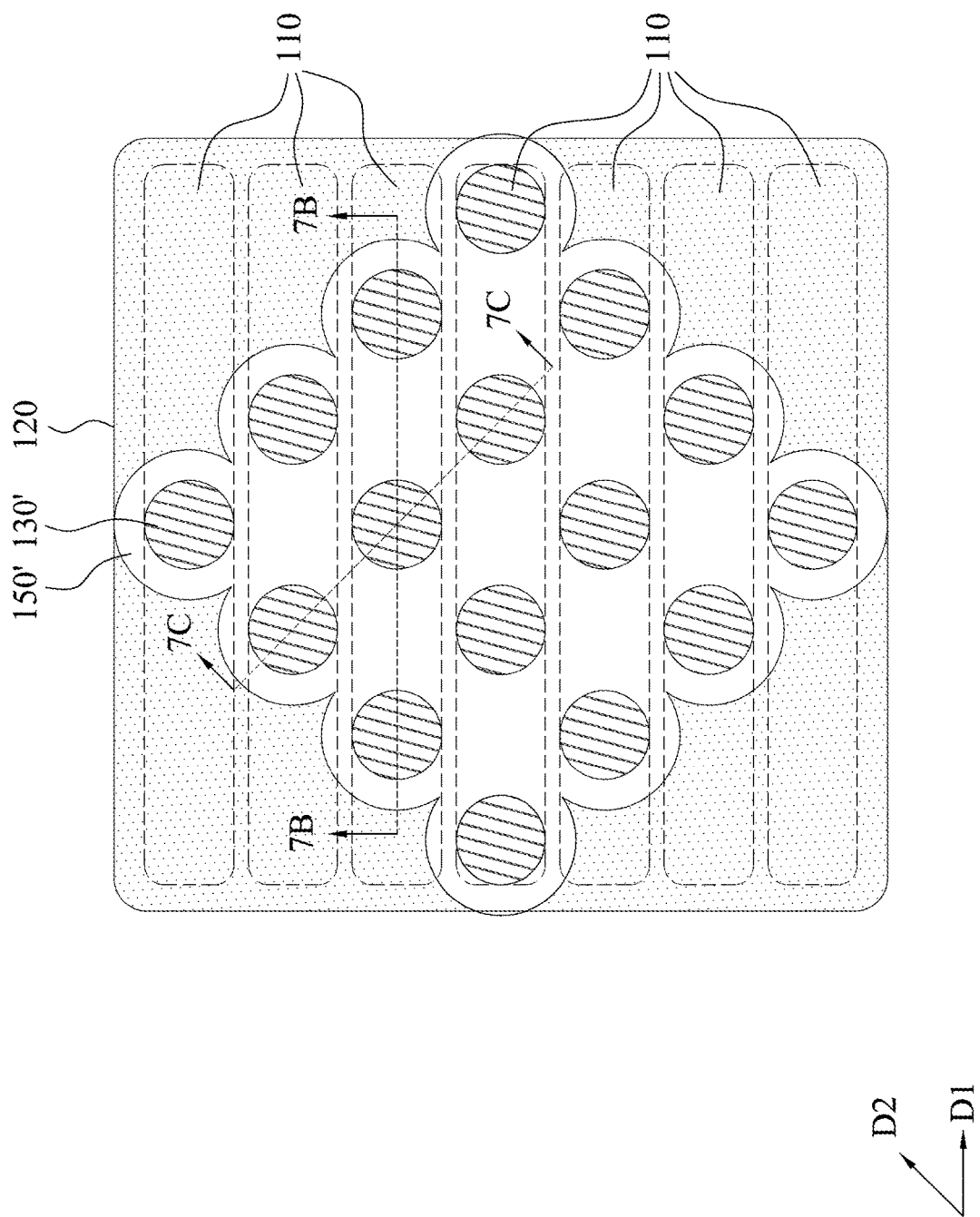

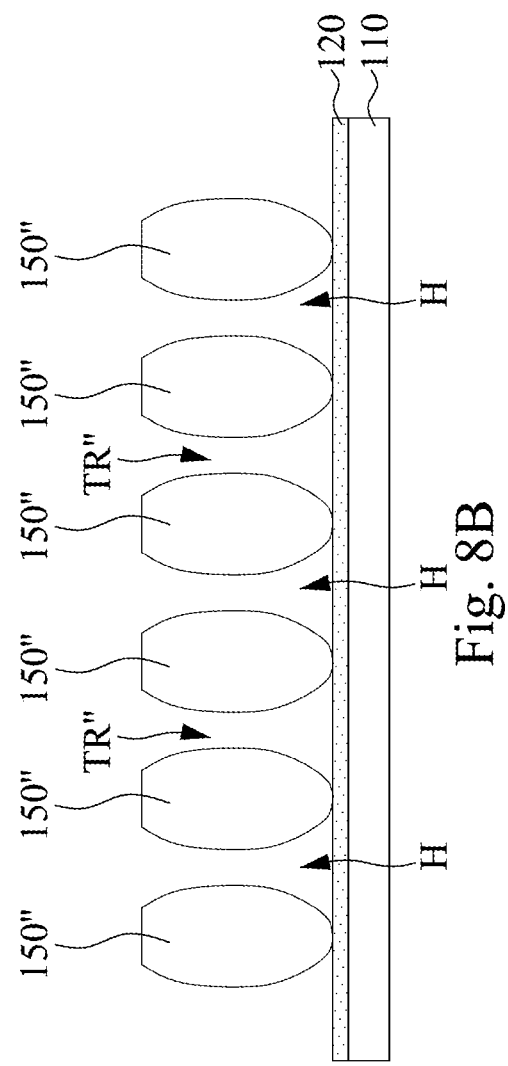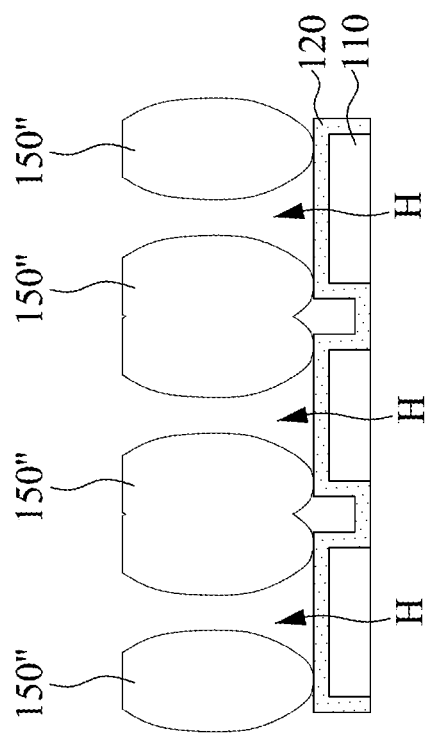

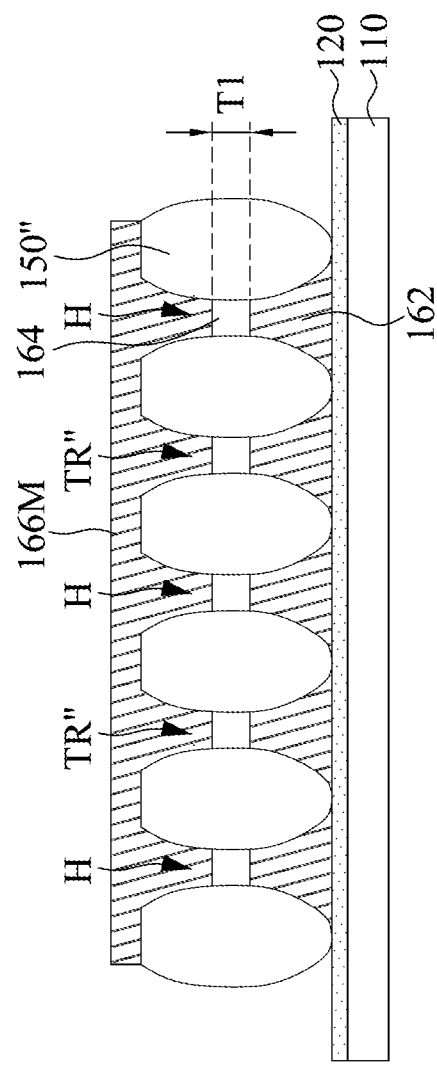
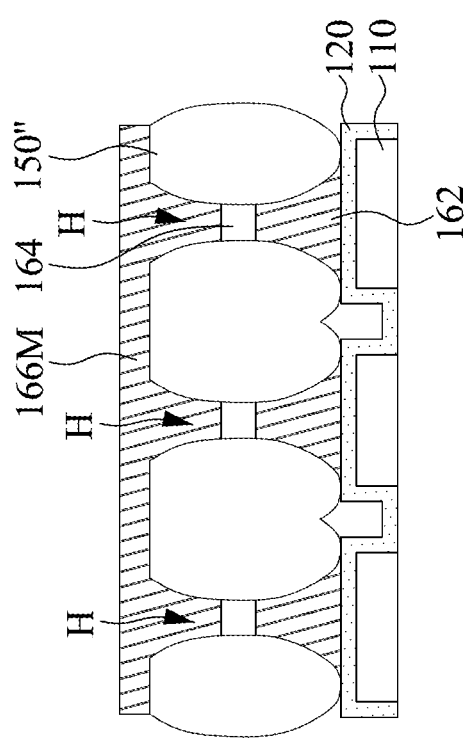
Fig. 12B
Fig. 12C

ELECTRICAL FUSE MATRIX

BACKGROUND

Field of Invention

The present invention relates to an electrical fuse matrix. More particularly, the present invention relates to an anti-fuse matrix.

Description of Related Art

In a conventional fabrication process, it is hard to generate holes with tight pitch by using single photo lithography process. Therefore, when anti-fuse structures are fabricated as a matrix, the volume of the electrical fuse matrix is hard to reduce due to the resolution limit of the photo lithography process. In addition, since the conventional anti-fuse structure has a cylindrical shape, there may be a possibility that the anti-fuse structure is not blown out properly.

Accordingly, how to provide an electrical fuse structure and a fabrication method of the electrical fuse structure so as to solve the problems described above is still one of the develop direction for those in the industry.

SUMMARY

One aspect of the present disclosure provides an electrical fuse matrix.

In one embodiment of the present disclosure, the electrical fuse matrix includes a plurality of anti-fuse structures, a plurality of top metal plates, and a plurality of bottom metal plates. The anti-fuse structures are arranged in a matrix, and each of the anti-fuse structure includes a top conductive structure, a bottom conductive structure, and a dielectric film disposed between the top conductive structure and the bottom conductive structure. The anti-fuse structure has an hourglass shape. The top metal plates are disposed on the top conductive structures. The bottom metal plates are disposed on the bottom conductive structures.

In one embodiment of the present disclosure, each of the top metal plates is electrically connected to at least one of the top conductive structures, and each of the bottom metal plates is electrically connected to at least one of the bottom conductive structures.

In one embodiment of the present disclosure, the top metal plates extend along a first direction, and the bottom metal plates extend along a second direction different from the first direction.

In one embodiment of the present disclosure, the electrical fuse matrix further includes a seed layer electrically connected with the bottom metal plate and the bottom conductive structures.

In one embodiment of the present disclosure, a dimension of each of the dielectric films is smaller than dimensions of the top conductive structures and the bottom conductive structures.

In one embodiment of the present disclosure, each of the dielectric films has a minimal width located in a range from about 8 nanometers to 15 nanometers.

In one embodiment of the present disclosure, each of the dielectric films has a thickness located in a range from about 30 angstroms to 100 angstroms.

In one embodiment of the present disclosure, each of the top conductive structures has a taper shape, and each of the bottom conductive structures has a taper shape.

In one embodiment of the present disclosure, each of the top conductive structures has a surface connected with the top metal plate, each of the bottom conductive structures has a surface connected with the bottom metal plate, and widths of the surfaces of the top conductive structures and the bottom conductive structures are located in a range from about 30 nanometers to 40 nanometers.

In one embodiment of the present disclosure, the electrical fuse matrix further includes an insulating layer surrounding the anti-fuse structures and the seed layer.

Another aspect of the present disclosure is a fabrication method of the electrical fuse matrix.

In one embodiment of the present disclosure, the method of forming the electrical fuse matrix includes forming a plurality of poly-silicon cylinders on a plurality of bottom metal plates; performing thermal oxidation on the poly-silicon cylinders such that a first silicon oxide layer is formed to surround the poly-silicon cylinders, wherein a plurality of trenches are formed between the poly-silicon cylinders; removing the poly-silicon cylinders to form a plurality of holes; forming a plurality of anti-fuse structures in the trenches and the holes; and forming a plurality of top metal plates on the anti-fuse structures.

In one embodiment of the present disclosure, the method of forming the electrical fuse matrix further includes forming a seed layer on the bottom metal plates before forming the poly-silicon cylinders.

In one embodiment of the present disclosure, the method of forming the electrical fuse matrix further includes forming a second silicon oxide layer on the first silicon oxide layer such that a top surface of the seed layer is covered by the second silicon oxide layer after performing the thermal oxidation.

In one embodiment of the present disclosure, forming the second silicon oxide layer such that each of the trenches between the poly-silicon cylinders has a minimum width substantially the same as the minimum width of the poly-silicon cylinders.

In one embodiment of the present disclosure, the method of forming the electrical fuse matrix further includes removing portions of the second oxide layer in the trenches after forming the second silicon oxide layer.

In one embodiment of the present disclosure, the method of forming the electrical fuse matrix further includes planarizing a top surface of the first silicon oxide layer to expose the poly-silicon cylinders before removing the poly-silicon cylinders.

In one embodiment of the present disclosure, forming the anti-fuse structures in the trenches and the holes includes forming a plurality of bottom conductive structures, a plurality of dielectric films, and a plurality of top conductive structures sequentially.

In one embodiment of the present disclosure, the method further includes removing the first silicon oxide layer and portions of seed layer free from overlapping with the anti-fuse structures before forming the top metal plates.

In one embodiment of the present disclosure, the method further includes refilling an insulating layer to cover the bottom metal plates and to surround the anti-fuse structures and the seed layer after removing the first silicon oxide layer.

In one embodiment of the present disclosure, forming the top metal plates includes pattering a material of the top metal plates such that top metal plates and the bottom metal plates extend along different directions.

BRIEF DESCRIPTION OF THE DRAWINGS

The invention can be more fully understood by reading the following detailed description of the embodiment, with reference made to the accompanying drawings as follows:

FIGS. 2A to 7A are top views of the electrical fuse matrix in FIG. 1A at different mediate stages of a fabrication method of the electrical fuse matrix;

FIGS. 2B to 7B are cross-sectional views of the electrical fuse matrix respectively taken along lines 2B-2B to 16B-16B in FIGS. 2A-7A;

FIGS. 2C to 7C are cross-sectional views of the electrical fuse matrix respectively taken along lines 2C-2C to 16C-16C in FIGS. 2A-7A;

FIGS. 8A to 16A are top views of the electrical fuse matrix in FIG. 1A at different mediate stages of a fabrication method of the electrical fuse matrix;

FIGS. 8B to 16B are cross-sectional views of the electrical fuse matrix respectively taken along lines 8B-8B to 16B-16B in FIG. 8A-16A; and FIGS. 8C to 16C are cross-sectional views of the electrical fuse matrix respectively taken along lines 8C-8C to 16C-16C in FIGS. 8A-16A.

DETAILED DESCRIPTION

Figure 1A:
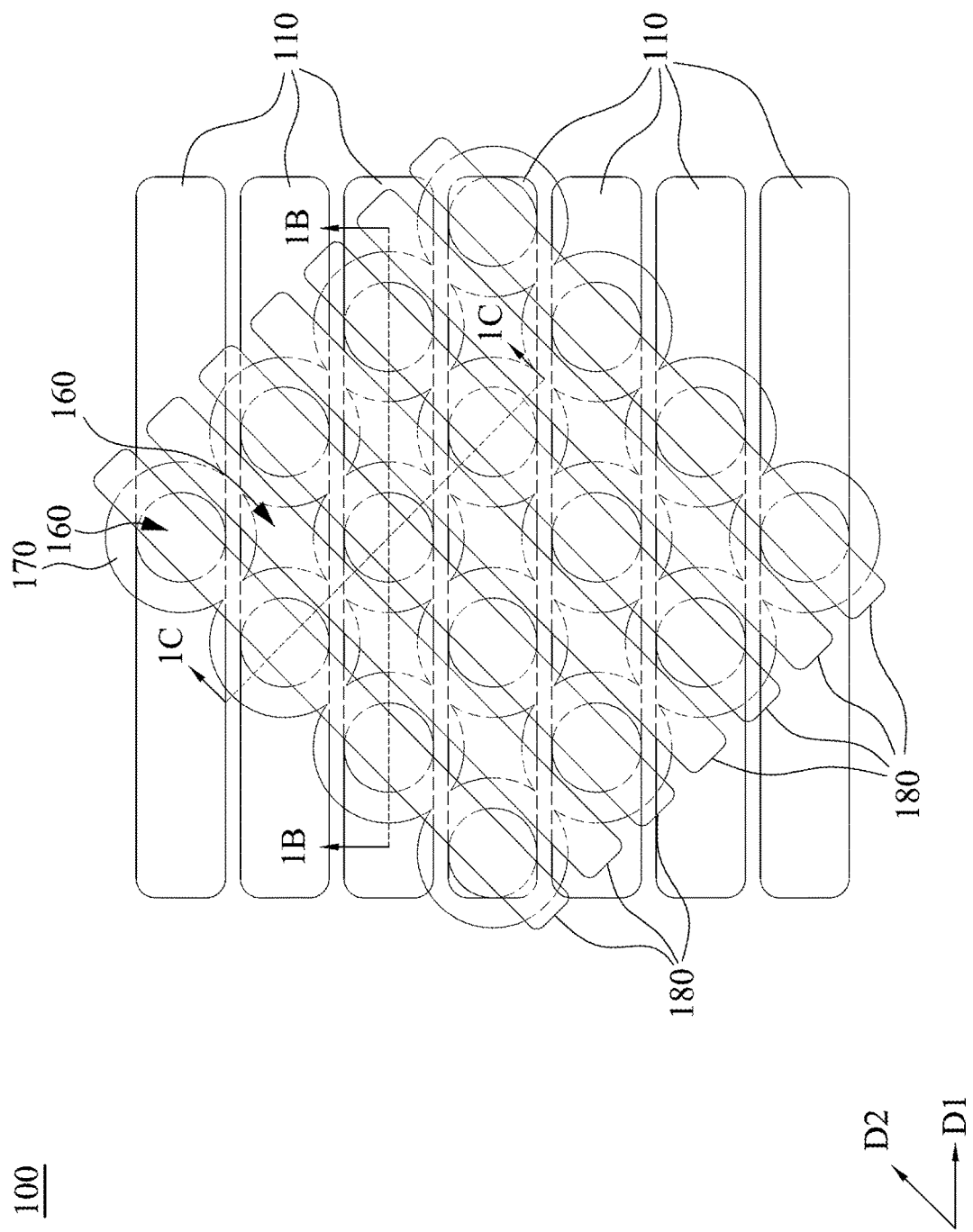
FIG. 1A is a top view of an electrical fuse matrix according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

Figure 1B:
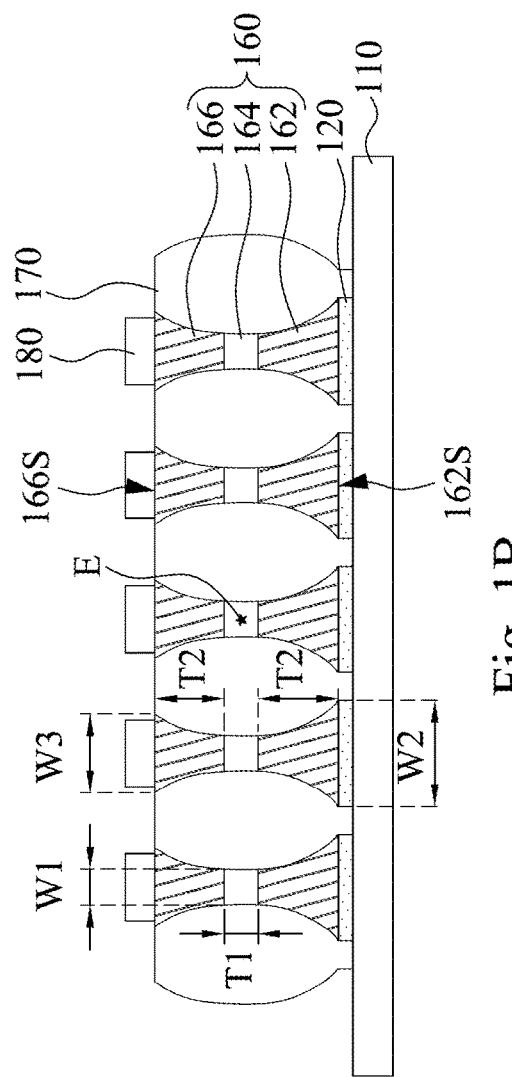
FIG. 1B is a cross-sectional view of the electrical fuse matrix taken along line 1B-1B in FIG. 1A.
Figure 1C:
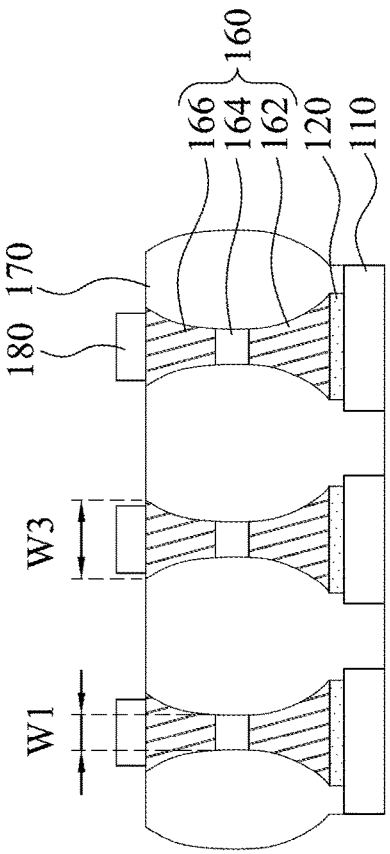
FIG. 1C is a cross-sectional view of the electrical fuse matrix taken along line 1C-1C in FIG. 1A.

FIG. 1A is a top view of an electrical fuse matrix 100 according to one embodiment of the present disclosure. FIG. 1B is a cross-sectional view of the electrical fuse matrix 100 taken along line 1B-1B in FIG. 1A. FIG. 1C is a cross-sectional view of the electrical fuse matrix 100 taken along line 1C-1C in FIG. 1A. Reference is made to FIGS. 1A, 1B, and 1C simultaneously. The electrical fuse matrix 100 includes a plurality of anti-fuse structures 160 arranged in a matrix, a plurality of bottom metal plates 110, and a plurality of top metal plates 180. Each of the anti-fuse structure 100 includes a top conductive structure 166, a bottom conductive structure 162, and a dielectric film 164 disposed between the top conductive structure 166 and the bottom conductive structure 162. As shown in FIG. 1B and FIG. 1C, each of the anti-fuse structures 160 has an hourglass shape. The top metal plates 180 are disposed on the top conductive structures 166, and the bottom metal plates 110 are disposed on the bottom conductive structures 162.

The electrical fuse matrix 100 further includes a seed layer 120 and an insulating layer 170. The seed layer 120 is disposed between the anti-fuse structures 160 and the bottom metal plates 110. The seed layer 120 includes a plurality of portions that are electrically connected with the bottom metal plates 110 and the bottom conductive structures 162. The insulating layer 170 is disposed between the bottom metal plates 110 and the top metal plates 180. The insulating layer 170 surrounds the anti-fuse structures 110 and the seed layer 120.

As shown in FIGS. 1B and 1C, a dimension of each of the dielectric films 164 is smaller than dimensions of the top conductive structures 166 and the bottom conductive structures 162. Each of the top conductive structures 166 has a taper shape, and each of the bottom conductive structures has a taper shape. Specifically, each of the dielectric films 164 has a minimal width W1 located in a range from about 8 nanometers to 15 nanometers. Each of the dielectric films 164 has a thickness T1 located in a range from about 30 angstroms to 100 angstroms. Each of the top conductive structures 166 has a surface 166S connected with the top metal plates 180, each of the bottom conductive structures 162 has a surface 162S connected with the bottom metal plates 110. Widths W3 of the surface 166S of the top conductive structures 166 and widths W2 of the surface 162S of the bottom conductive structure are located in a range from about 30 nanometers to 40 nanometers. Each of the top conductive structures 166 and each of the bottom conductive structures 162 has a thickness T2 located in a range from about 200 nanometers to 400 nanometers.

As shown in FIG. 1A, each of the top metal plates 180 is electrically connected to at least one of the top conductive structures 166, and each of the bottom metal plates 110 is electrically connected to at least one of the bottom conductive structures 164. In addition, each of the anti-fuse structure 160 is electrically connected to one of the top metal plates 180 and one of the bottom metal plates 110. The top metal plates 180 extend along a first direction D1, and the bottom metal plates 110 extend along a second direction D2 different from the first direction D1. In the present embodiment, the second direction D2 is not perpendicular to the first direction D1, but the present disclosure is not limited in these regard. In other embodiment, the top metal plates may extend along a direction perpendicular to the first direction D1, as long as no more than one of the anti-fuse structures 100 is electrically connected to the same one of the top metal plates 180 and the same one of the bottom metal plates 110 simultaneously.

Figure 2A:
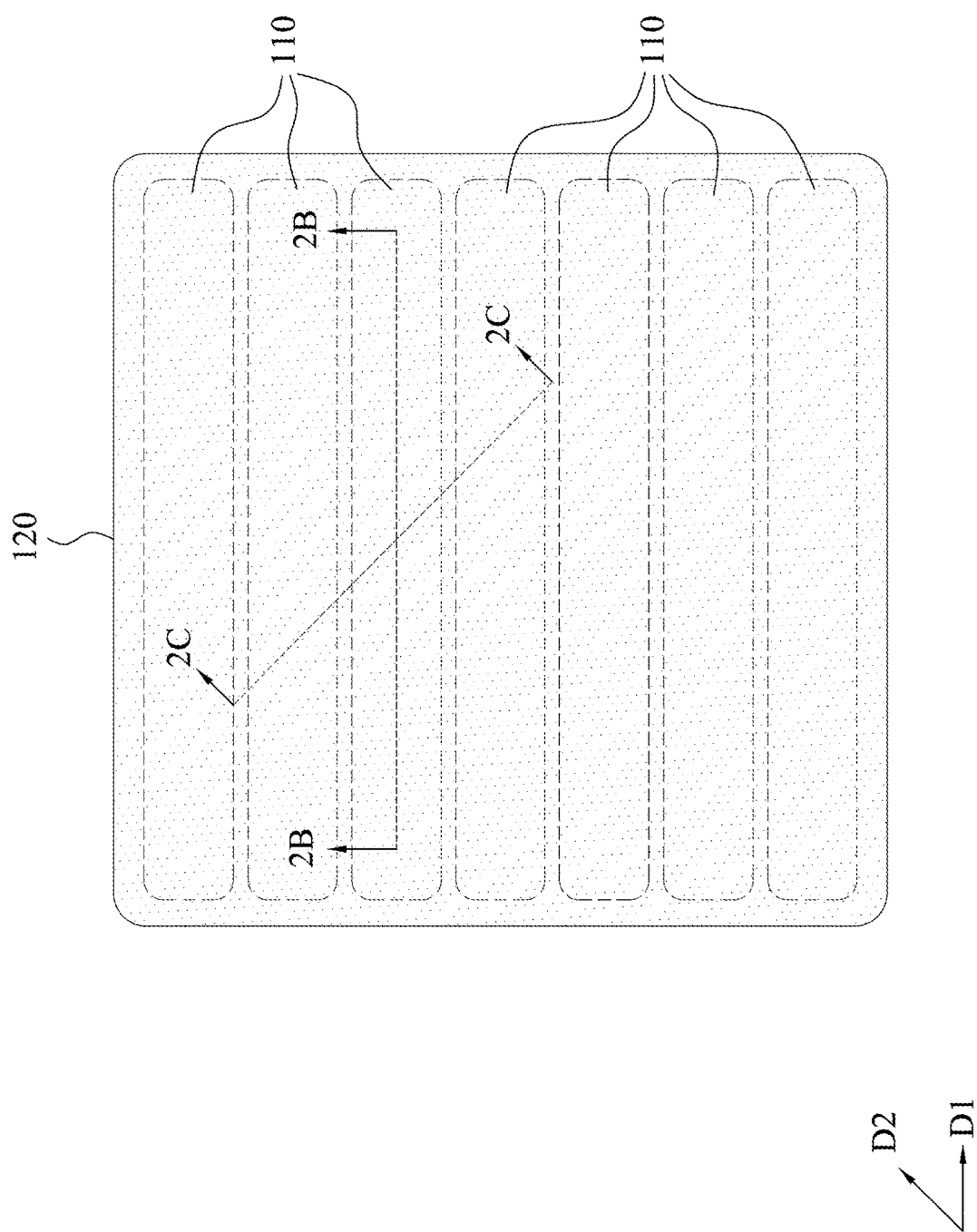
Figure 2B:
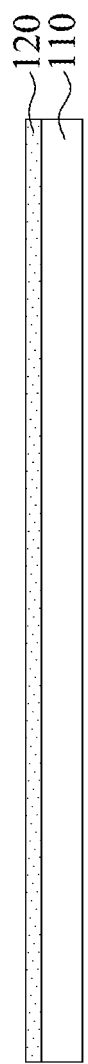
Figure 2C:
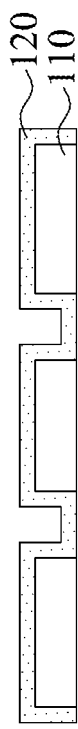

FIG. 2A is a top view of the electrical fuse matrix 100 in FIG. 1A at a mediate stage of a fabrication method of the electrical fuse matrix 100. FIG. 2B is a cross-sectional view of the electrical fuse matrix 100 taken along lines 2B-2B in FIG. 2A. FIG. 2C is a cross-sectional view of the electrical fuse matrix 100 taken along line 2C-2C in FIG. 2A. Reference is made to FIGS. 2A, 2B, and 2C simultaneously. The bottom metal plates 110 are deposited on a substrate (not shown) by metal plating and patterning, for example, on a dielectric layer of an electronic device. The bottom metal plates 110 may include metal such as Aluminum (Al), Tungsten (W), Copper (Cu), or combination thereof. The bottom metal plates 110 are parallel with each other and extend along the first direction D1. The seed layer 120 is disposed on and between the bottom metal plates 110. The seed layer 120 is formed by metal sputter such that the bottom conductive structures 162 (see FIG. 1B or FIG. 1C) of the anti-fuse structures 100 may be formed above the bottom metal plates 110. The seed layer 120 may include Cu or Cu alloy such as TiCu, but the present disclosure is not limited in these regards.

Figure 3A:
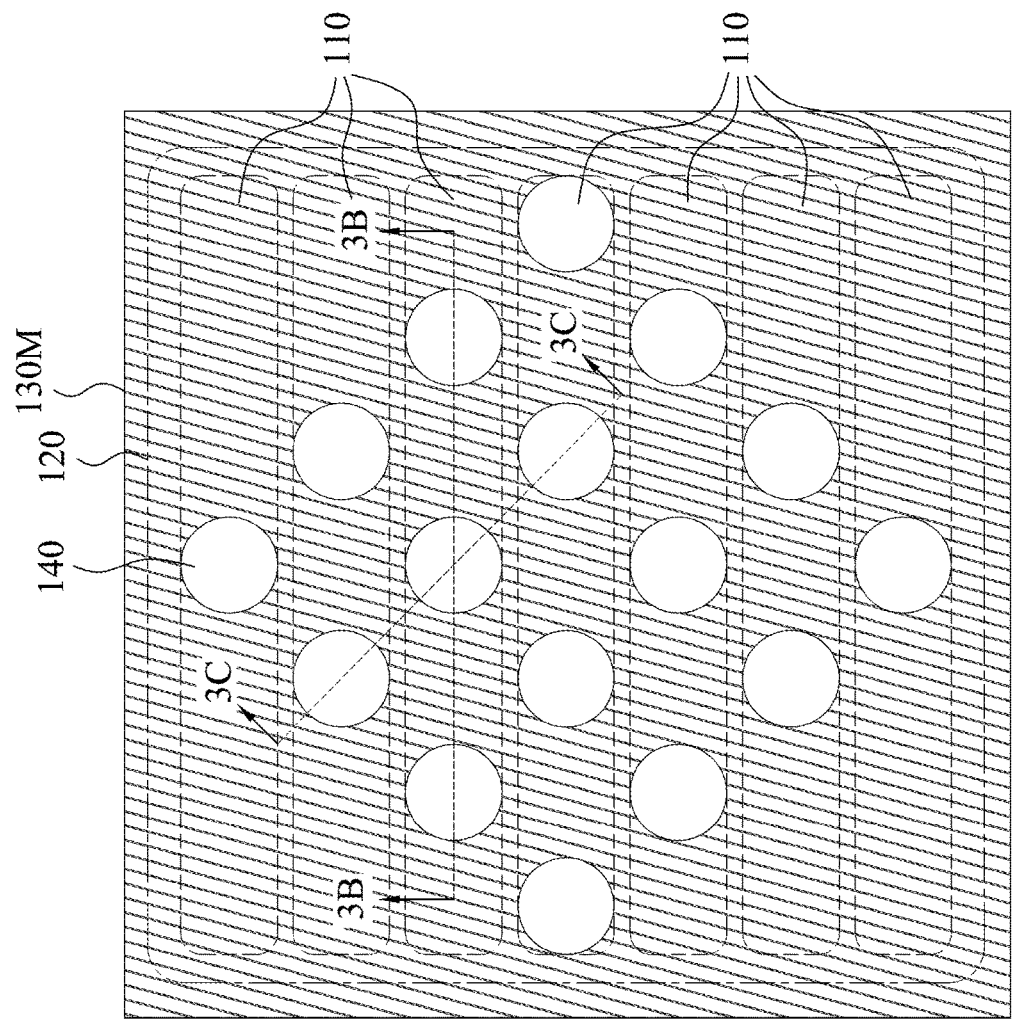
Figure 3B:
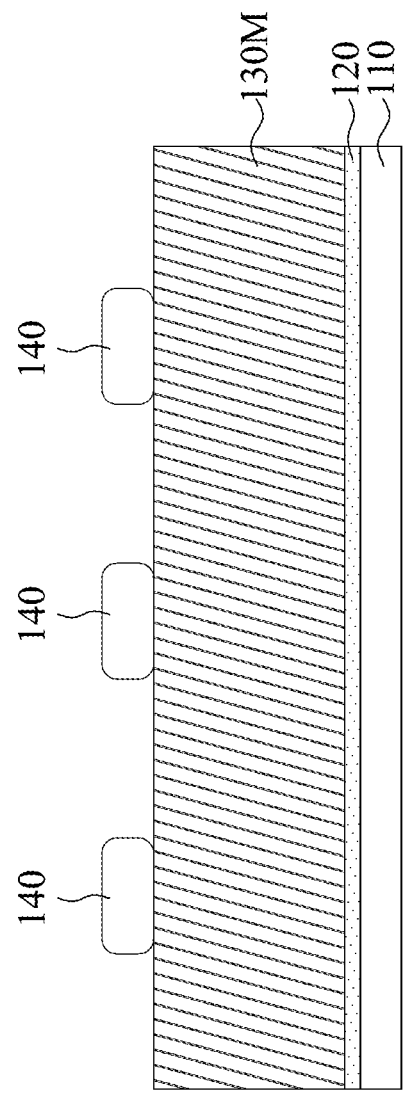
Figure 3C:
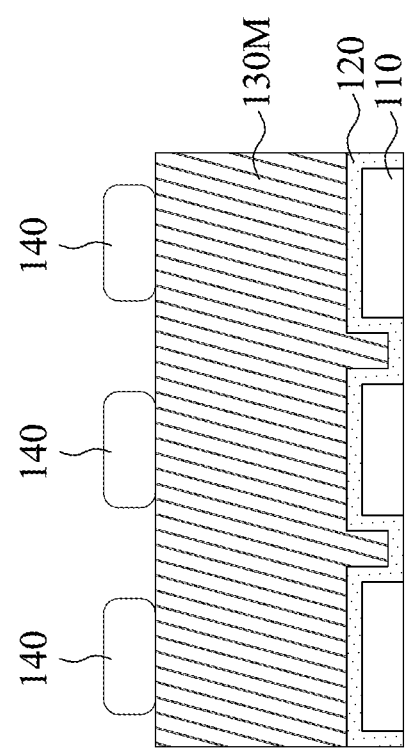

FIG. 3A is a top view of the electrical fuse matrix 100 in FIG. 1A at a mediate stage of a fabrication method of the electrical fuse matrix 100. FIG. 3B is a cross-sectional view of the electrical fuse matrix 100 taken along lines 3B-3B in FIG. 3A. FIG. 3C is a cross-sectional view of the electrical fuse matrix 100 taken along line 3C-3C in FIG. 3A. Reference is made to FIGS. 3A, 3B, and 3C simultaneously. A poly-silicon layer 130M is deposited on the seed layer 120. A photoresist layer 140 is formed above the poly-silicon layer 130M such that portions of the poly-silicon layer 130M exposed from the photoresist layer 140 may be etched.

Figure 4A:
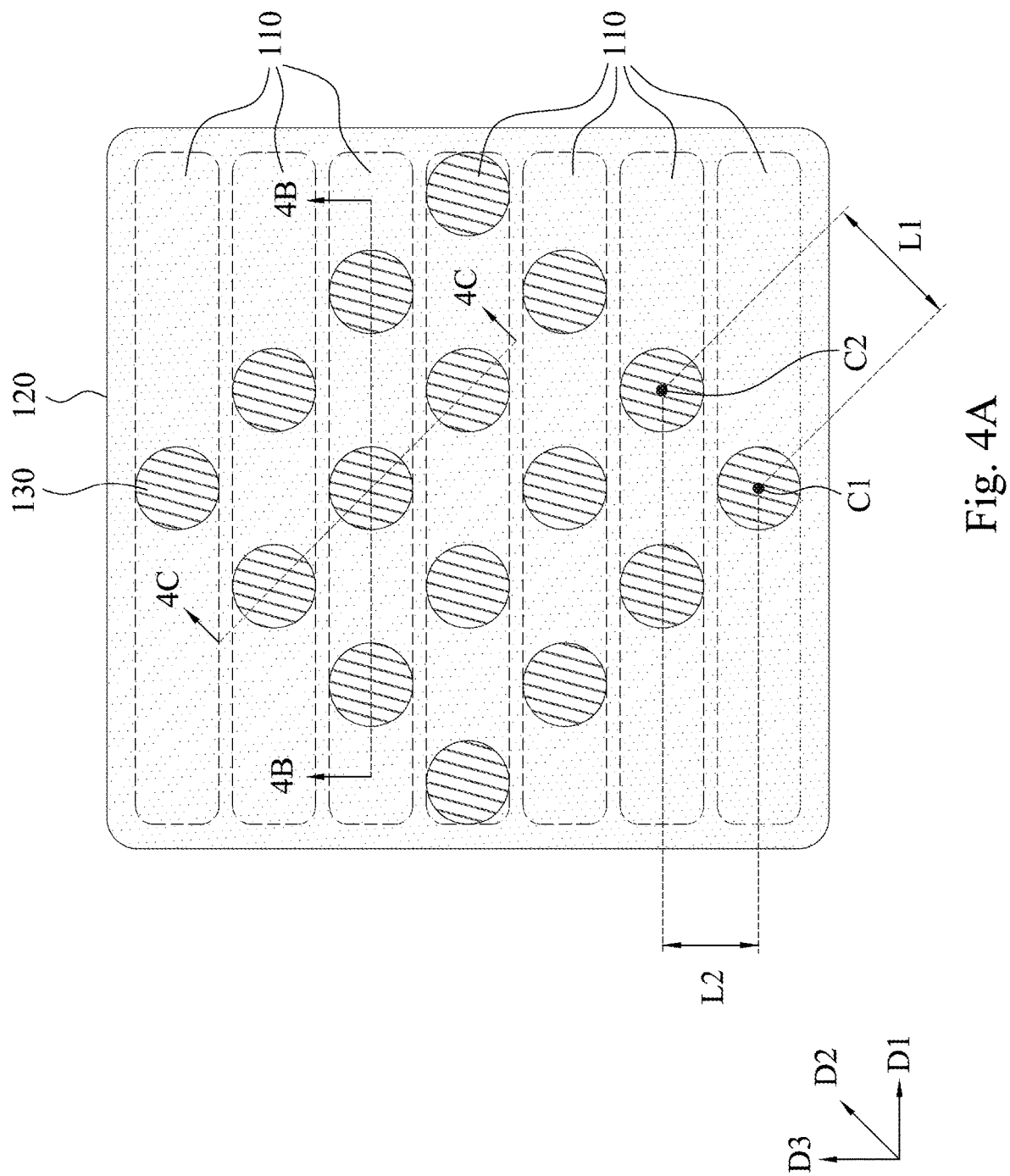
Figure 4B:
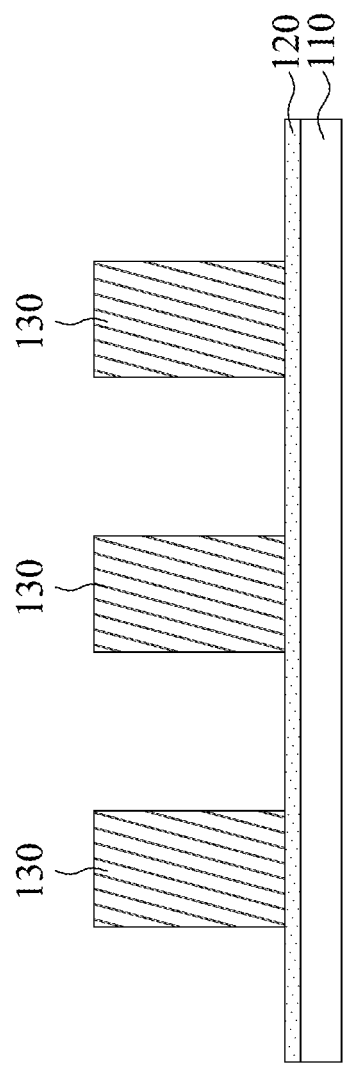
Figure 4C:
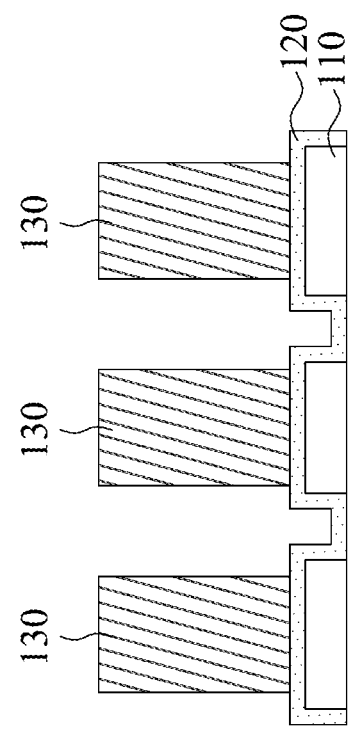

FIG. 4A is a top view of the electrical fuse matrix 100 in FIG. 1A at a mediate stage of a fabrication method of the electrical fuse matrix 100. FIG. 4B is a cross-sectional view of the electrical fuse matrix 100 taken along lines 4B-4B in FIG. 4A. FIG. 4C is a cross-sectional view of the electrical fuse matrix 100 taken along line 4C-4C in FIG. 4A. Reference is made to FIGS. 4A, 4B, and 4C simultaneously. The portions of the poly-silicon layer 130M exposed from the photoresist layer 140 are etched such that the poly-silicon layer 130M is pattered. After patterning the poly-silicon layer 130M, the photoresist layer 140 is removed. As such, poly-silicon cylinders 130 separated from each other are formed on the seed layer 120.

Figure 5A:
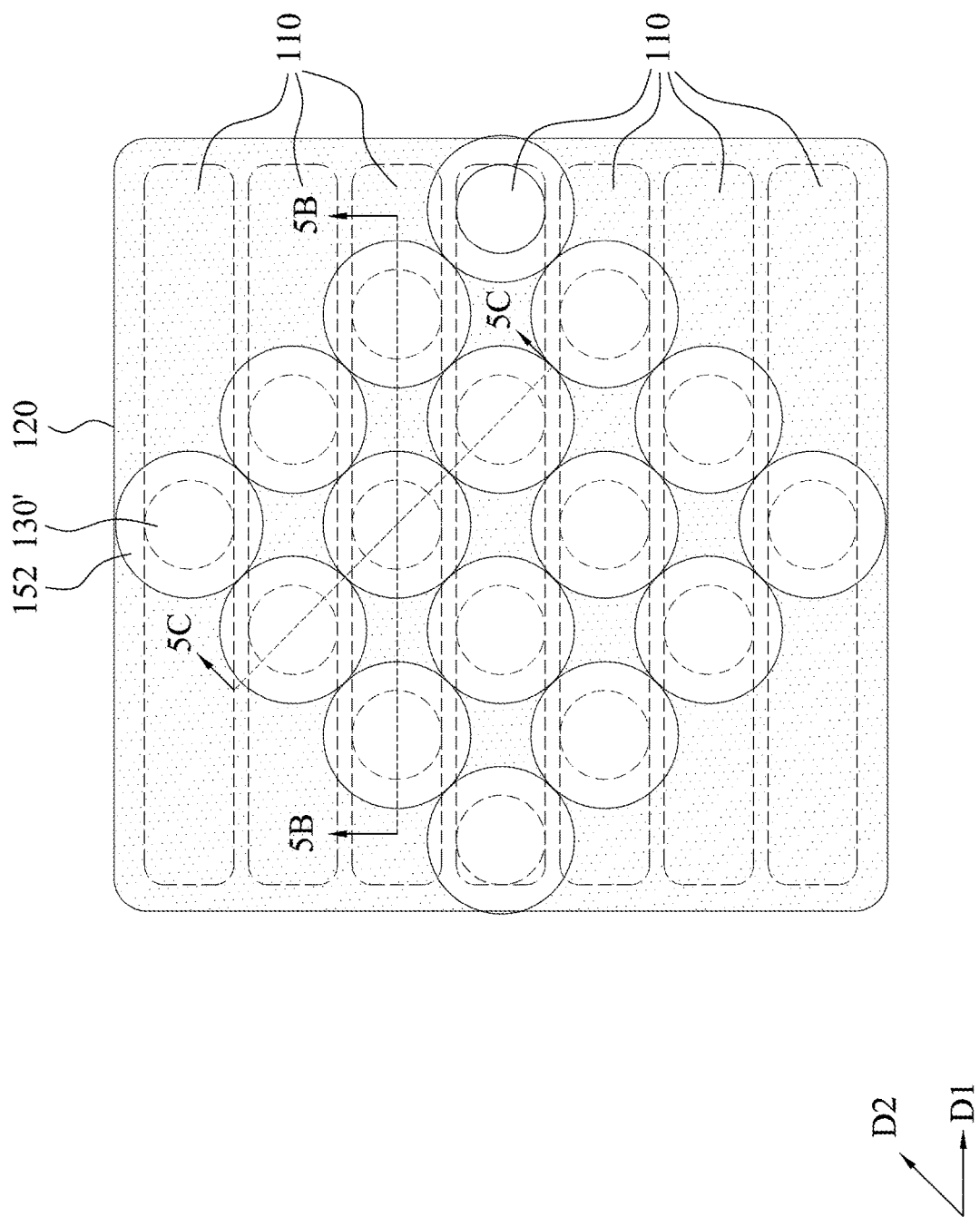
Figure 5B:
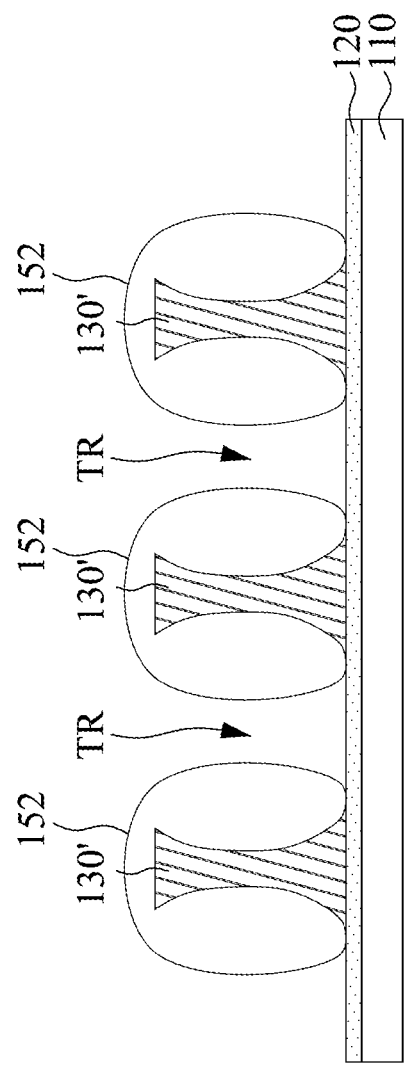
Figure 5C:
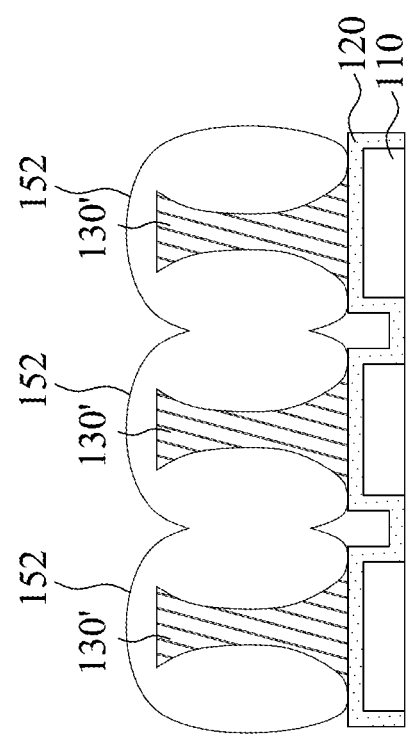

FIG. 5A is a top view of the electrical fuse matrix 100 in FIG. 1A at a mediate stage of a fabrication method of the electrical fuse matrix 100. FIG. 5B is a cross-sectional view of the electrical fuse matrix 100 taken along lines 5B-5B in FIG. 5A. FIG. 5C is a cross-sectional view of the electrical fuse matrix 100 taken along line 5C-5C in FIG. 5A. Reference is made to FIGS. 4A-4C and FIGS. 5A-5C simultaneously. A thermal oxidation process is performed to the poly-silicon cylinders 130 such that a first silicon oxide layer 152 is formed to surround the poly-silicon cylinders 130. That is, the first silicon oxide layer 152 is formed outwardly from the poly-silicon cylinders 130. In some embodiment, the thermal oxidation process is performed with a temperature located in a range from about 750 degrees to 1100 degrees, but the present disclosure is not limited in this regard. After the thermal oxidation process, an outer portion of the poly-silicon cylinders 130 are oxidized. Therefore, after the oxidation process, each of the poly-silicon cylinders 130' has an hourglass shape. As shown in FIG. 5B, trenches TR are formed between the poly-silicon cylinders 130' and in the first silicon oxide layer 152. The trenches TR are arranged along the first direction D1, and each of the trenches TR has an hourglass shape.

Figure 6A:
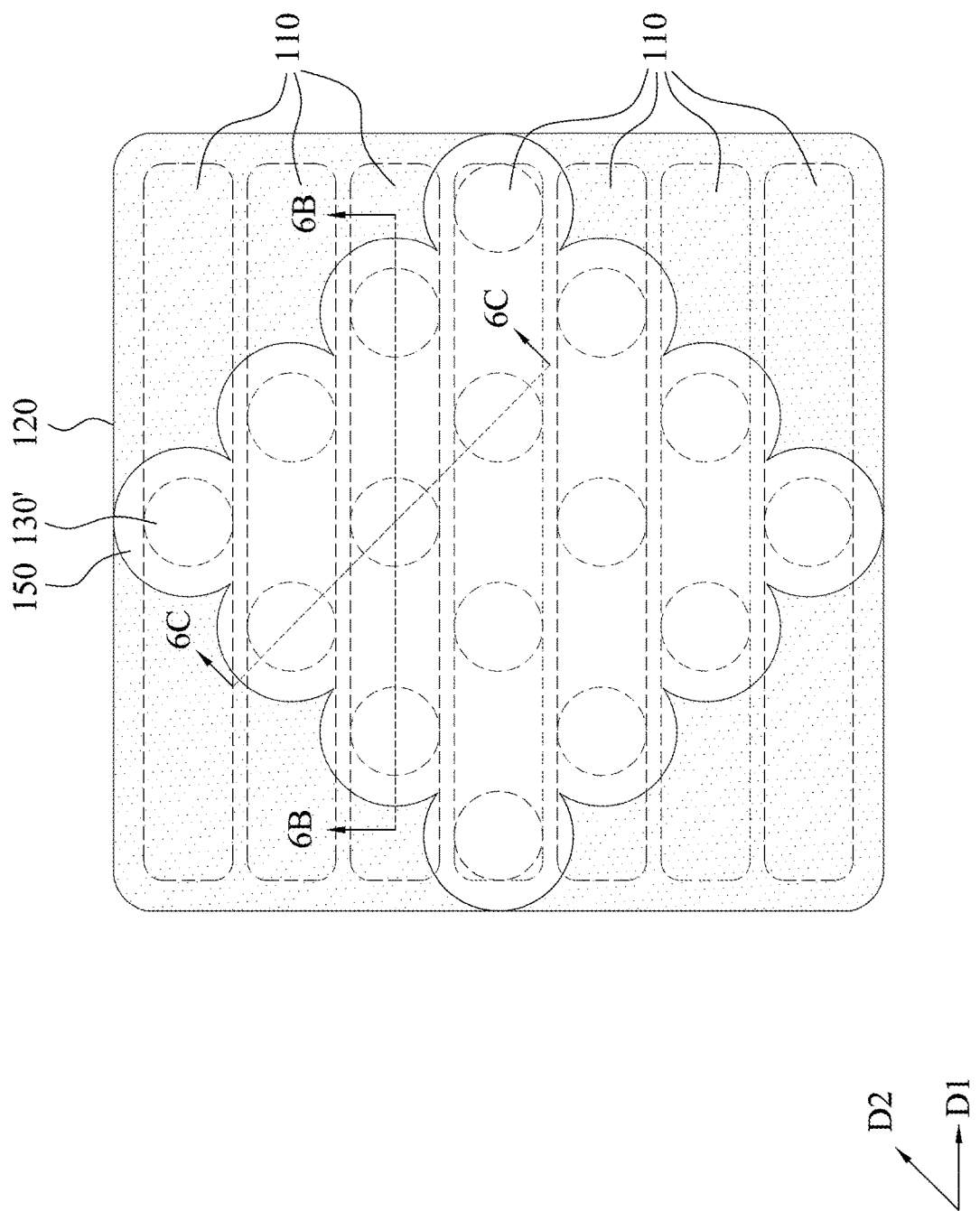
Figure 6B:
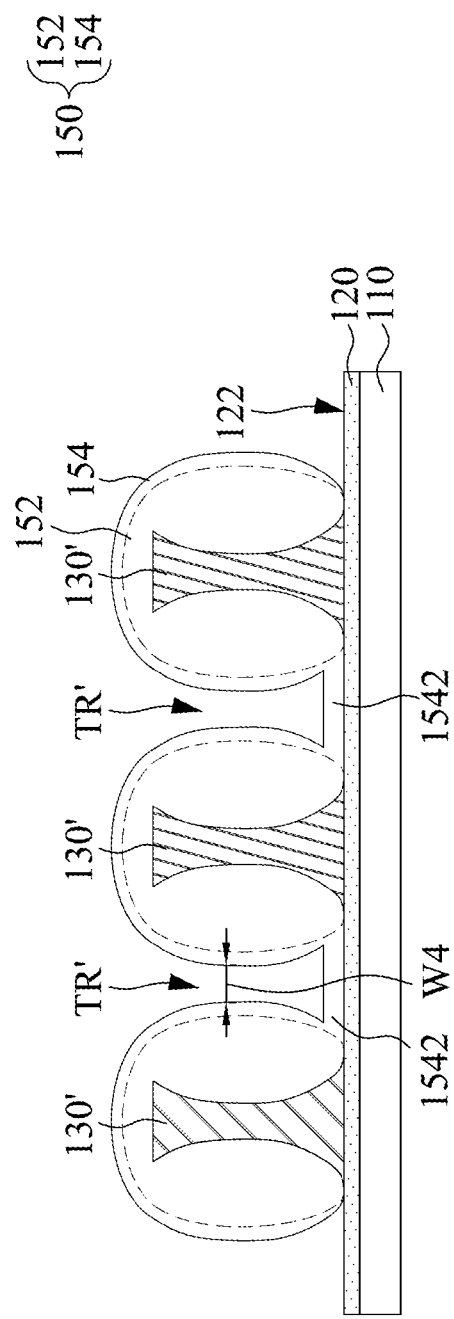
Figure 6C:
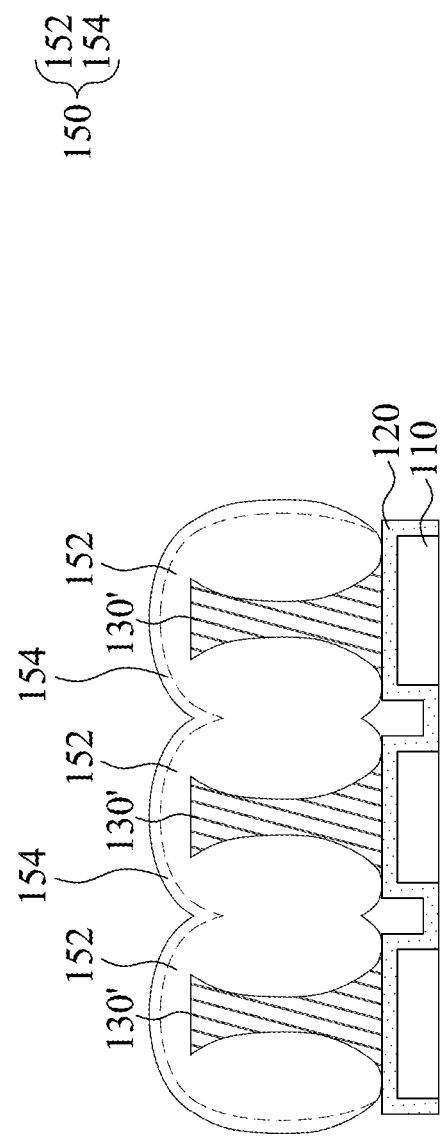

FIG. 6A is a top view of the electrical fuse matrix 100 in FIG. 1A at a mediate stage of a fabrication method of the electrical fuse matrix 100. FIG. 6B is a cross-sectional view of the electrical fuse matrix 100 taken along lines 6B-6B in FIG. 6A. FIG. 6C is a cross-sectional view of the electrical fuse matrix 100 taken along line 6C-6C in FIG. 6A. Reference is made to FIGS. 6A, 6B, and 6C simultaneously. A second silicon oxide layer 154 is formed on the first silicon oxide layer 152. A top surface 122 of the seed layer 120 is covered by portions 1542 of the second silicon oxide layer 154. As such, a minimum width W4 of each of the trenches TR' is reduced, and the minimum width W4 is substantially the same as the minimum width W1 of the dielectric films 164 (see FIG. 1A) of the anti-fused structures 160. Therefore, the first silicon oxide layer 152 and the second silicon oxide layer 154 may be considered as a spacer 150 used to define the minimum width W4 of the trenches TR'. In the present embodiment, the second silicon oxide layer 154 is formed through Chemical Vapor Deposition (CVD) method, but the present disclosure is not limited in this regard. The minimum width W4 may be determined by adjusting the process parameters such as deposition time of the deposition process so as to modify the minimum width W4 to a desired value. In other words, by depositing a second silicon oxide layer 154, the minimum width W4 can be smaller than a limited value that can be achieved by using photo lithography method.

Figure 7B:
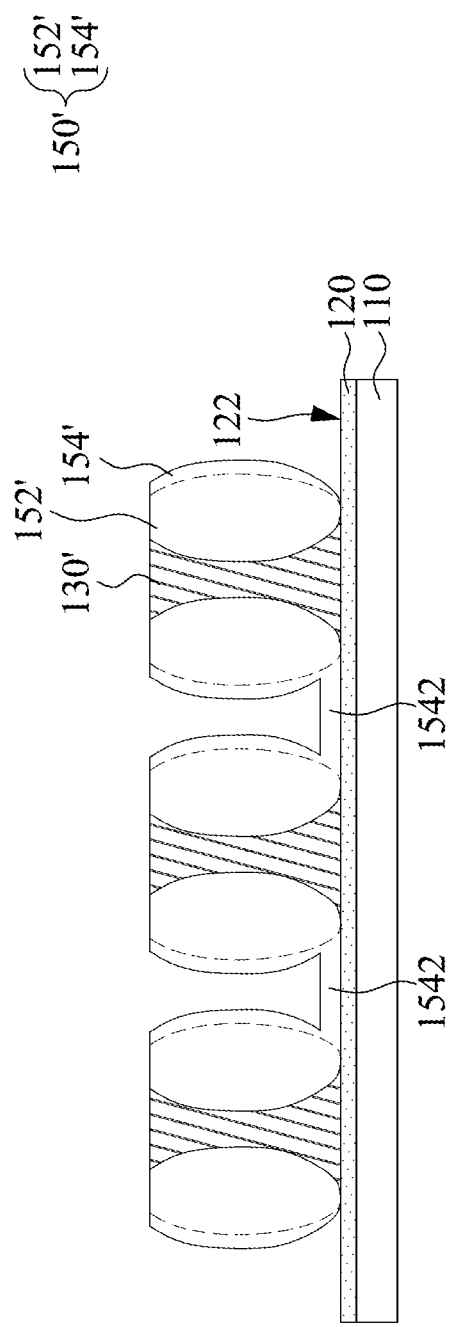
Figure 7C:
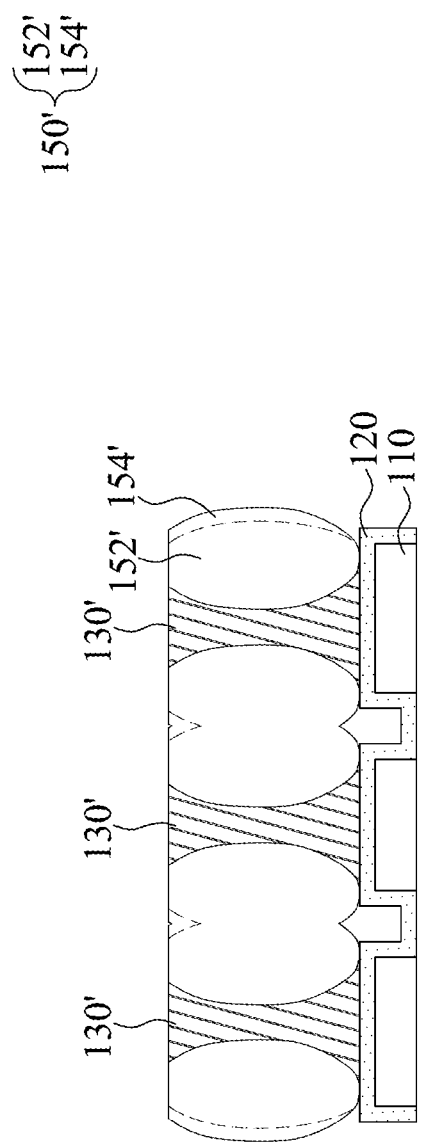

FIG. 7A is a top view of the electrical fuse matrix 100 in FIG. 1A at a mediate stage of a fabrication method of the electrical fuse matrix 100. FIG. 7B is a cross-sectional view of the electrical fuse matrix 100 taken along line 7B-7B in FIG. 7A. FIG. 7C is a cross-sectional view of the electrical fuse matrix 100 taken along line 7C-7C in FIG. 7A. Reference is made to FIGS. 6A-6C and 7A-7C simultaneously. A planarization process is performed on the spacer 150. An upper portion of the first silicon oxide layer 152 and an upper portion of the second silicon oxide layer 154 are removed such that a top surface of the poly-silicon cylinders 130' are exposed from the spacer 150'. In the present embodiment, the planarization process may be performed through Chemical Mechanical Polishing (CMP) process, but the present disclosure is not limited in this regard.

Figure 7D:
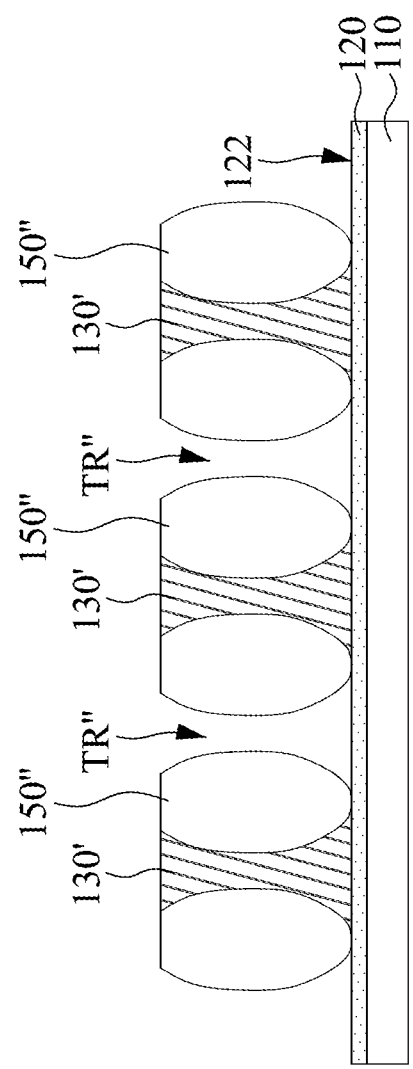
FIG. 7D is cross-sectional view of the electrical fuse matrix taken along line 7B-7B in FIG. 7A.

FIG. 7D is a cross-sectional view of the electrical fuse matrix 100 taken along line 7B-7B in FIG. 7A. After the planarization process, the portions 1542 of the second silicon oxide layer 154' are removed through strip process to expose the top surface 122 of the seed layer 120. After the strip process, each of the trenches TR" has an hourglass shape that are similar to the shapes of the poly-silicon cylinders 130'.

Figure 8A:
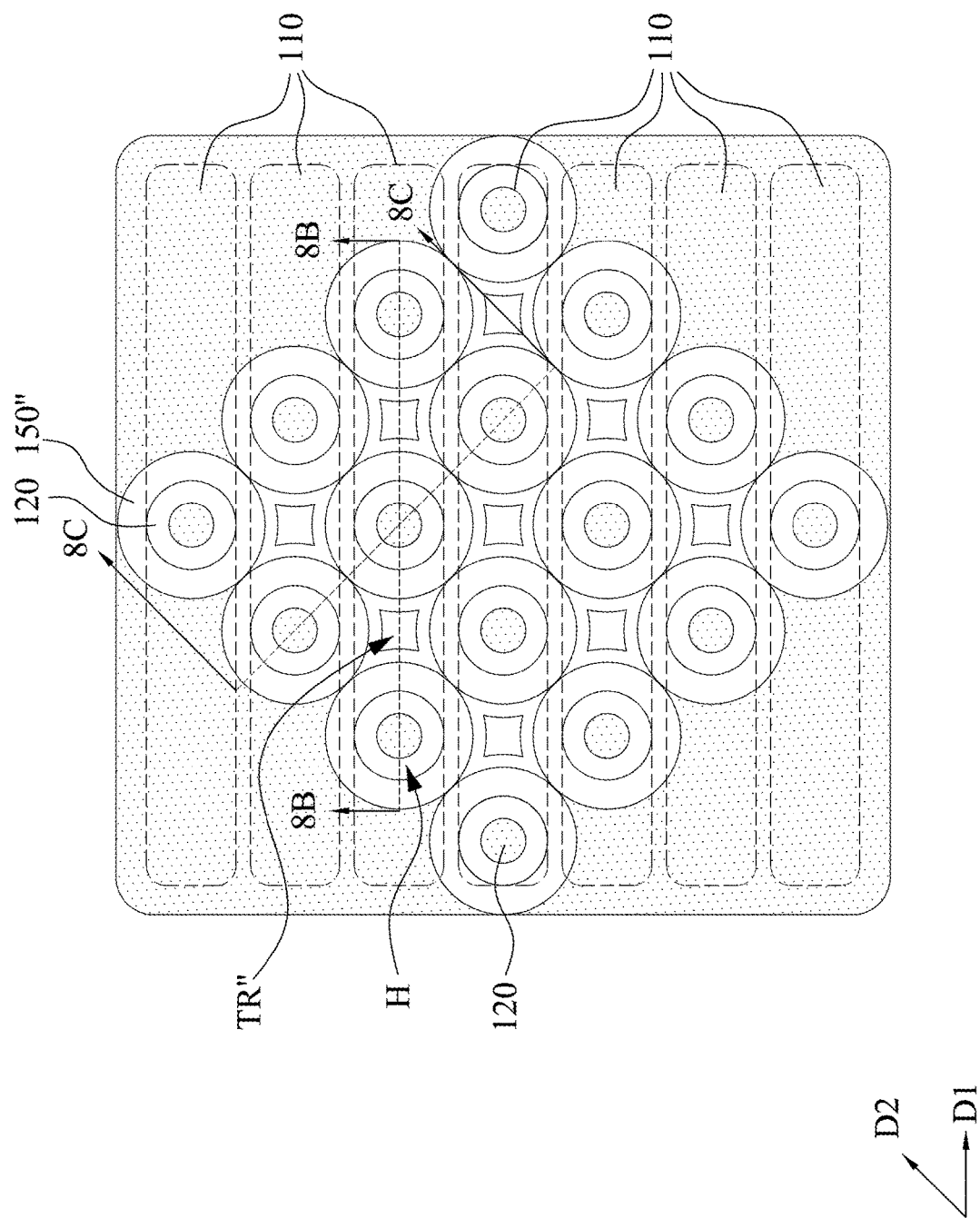

FIG. 8A is a top view of the electrical fuse matrix 100 in FIG. 1A at a mediate stage of a fabrication method of the electrical fuse matrix 100. FIG. 8B is a cross-sectional view of the electrical fuse matrix 100 taken along lines 8B-8B in FIG. 8A. FIG. 8C is a cross-sectional view of the electrical fuse matrix 100 taken along line 8C-8C in FIG. 8A. Reference is made to FIGS. 7A-7D and FIGS. 8A-8C simultaneously. The poly-silicon cylinders 130' are removed through strip process by using an etching solution containing potassium hydroxide (KOH). After removing the poly-silicon cylinders 130', a plurality of holes H are formed. As such, the trenches TR" and the holes H are arranged in a matrix. In other words, the holes H defined by the poly-silicon cylinders 130' and the trenches TR" defined by the spacer 150' collectively form a matrix.

Figure 9A:
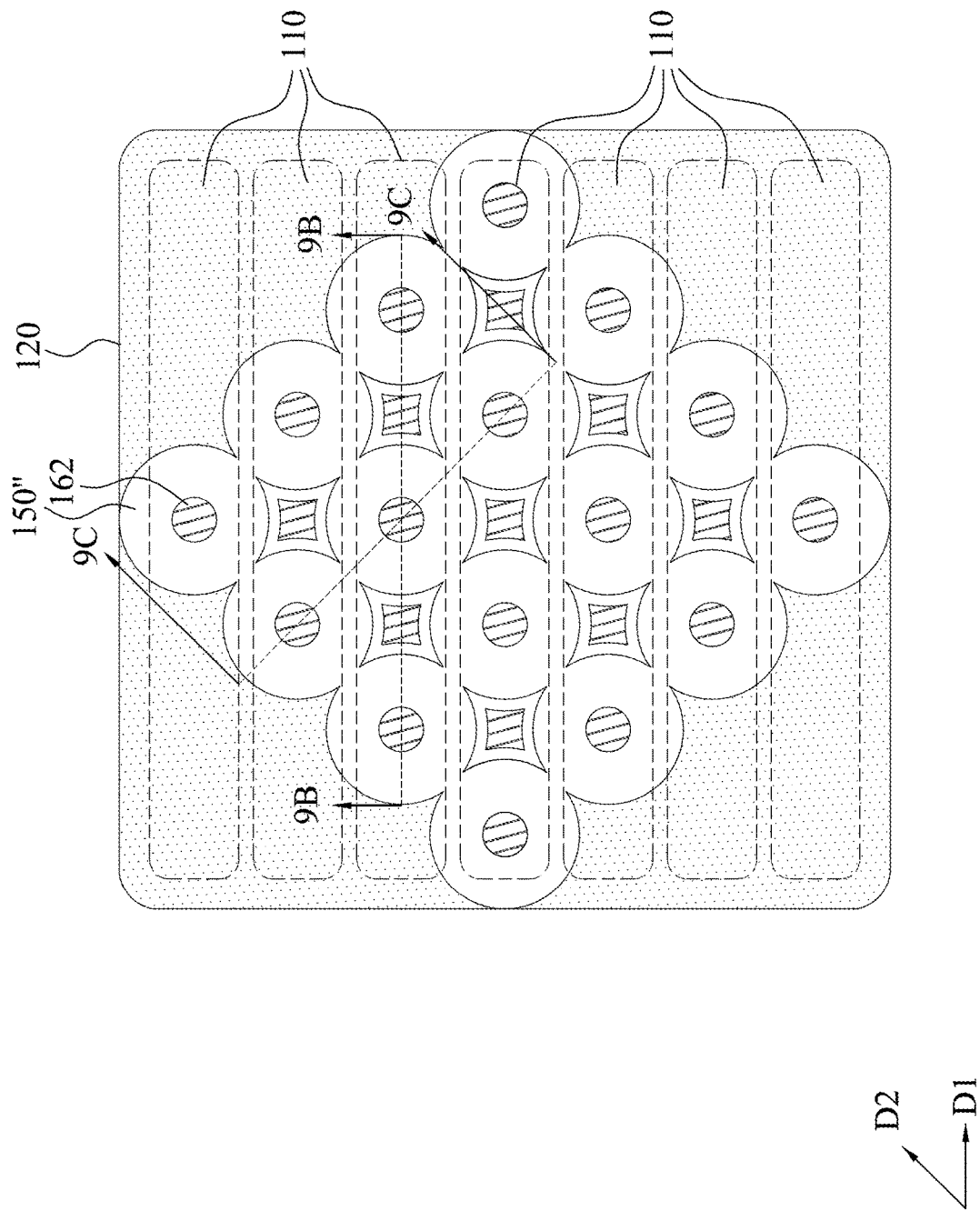
Figure 9B:
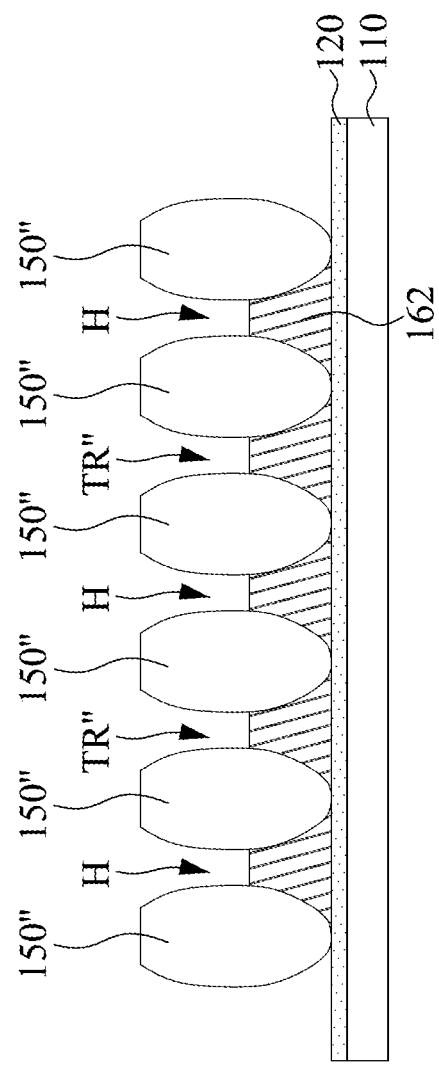
Figure 9C:
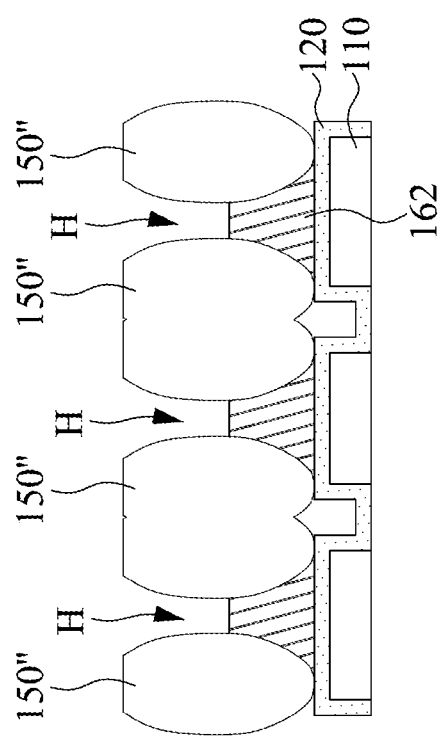

FIG. 9A is a top view of the electrical fuse matrix 100 in FIG. 1A at a mediate stage of a fabrication method of the electrical fuse matrix 100. FIG. 9B is a cross-sectional view of the electrical fuse matrix 100 taken along lines 9B-9B in FIG. 9A. FIG. 9C is a cross-sectional view of the electrical fuse matrix 100 taken along line 9C-9C in FIG. 9A. Reference is made to FIGS. 9A, 9B, and 9C simultaneously. The bottom conductive structures 162 are formed on the seed layer 120 through metal plating. The bottom conductive structures 162 may include metal such as Cu, W, or metal alloy. The bottom conductive structures 162 are electrically connected to the bottom metal plates 110 through the seed layer 120.

Figure 10A:
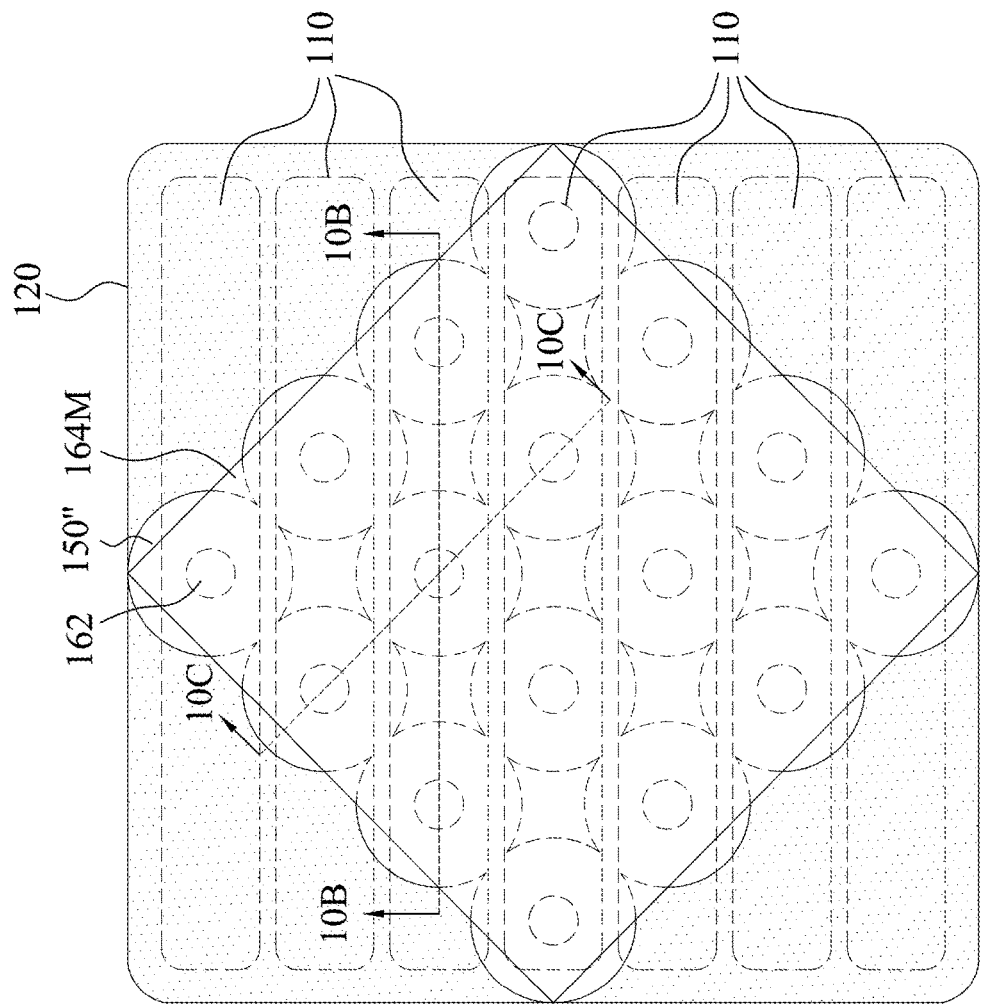
Figure 10B:
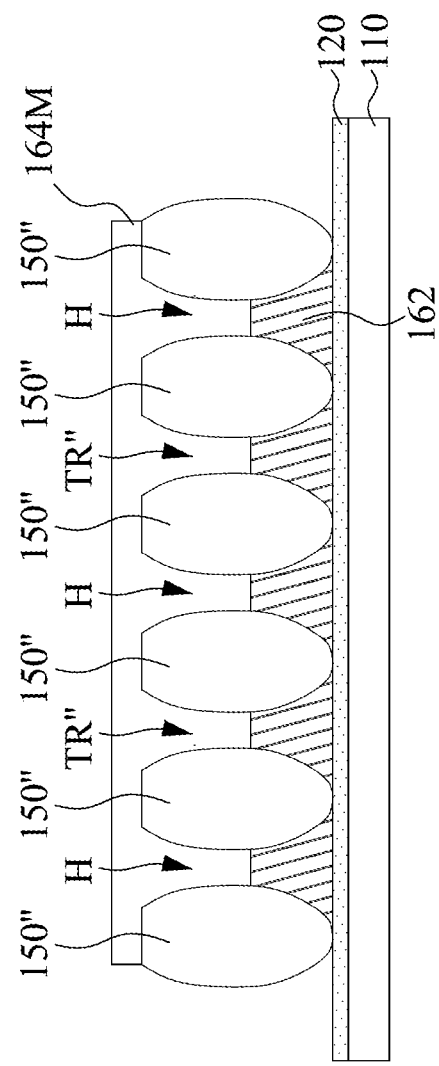
Figure 10C:
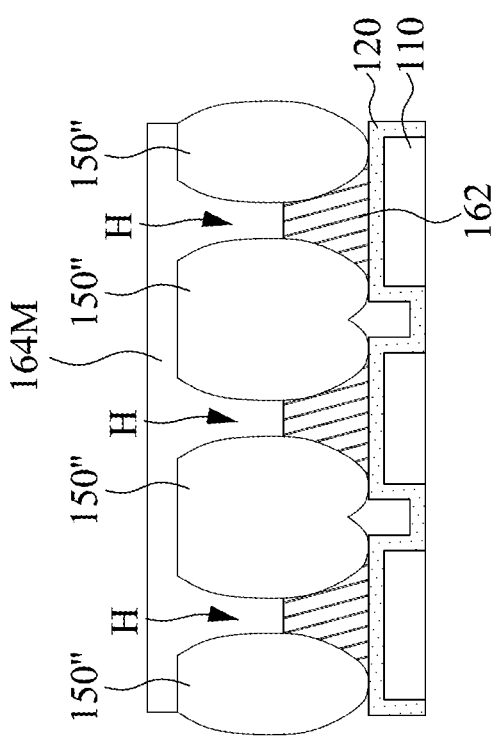

FIG. 10A is a top view of the electrical fuse matrix 100 in FIG. 1A at a mediate stage of a fabrication method of the electrical fuse matrix 100. FIG. 10B is a cross-sectional view of the electrical fuse matrix 100 taken along lines 10B-10B in FIG. 10A. FIG. 10C is a cross-sectional view of the electrical fuse matrix 100 taken along line 10C-10C in FIG. 10A. Reference is made to FIGS. 10A, 10B, and 10C simultaneously. A dielectric layer 164M is formed on the bottom conductive structures 162 and the spacer 150" through deposition method such as CVD, Atomic Layer Deposition (ALD), or Physical Vapor Deposition (PVD). The dielectric layer 164M includes high k material. A top surface of the spacer 150" is covered by the dielectric layer 164M.

Figure 11A:
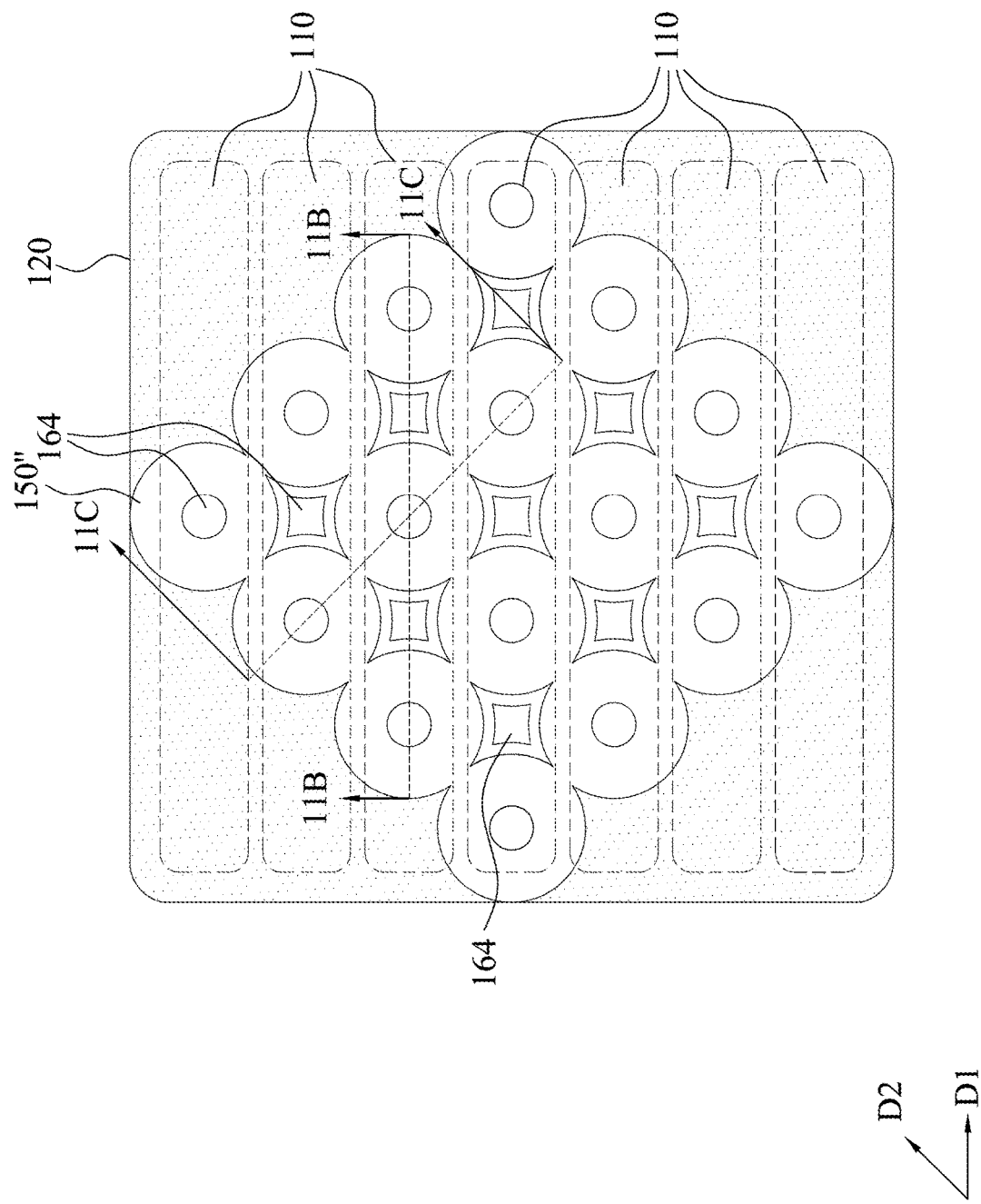
Figure 11B:
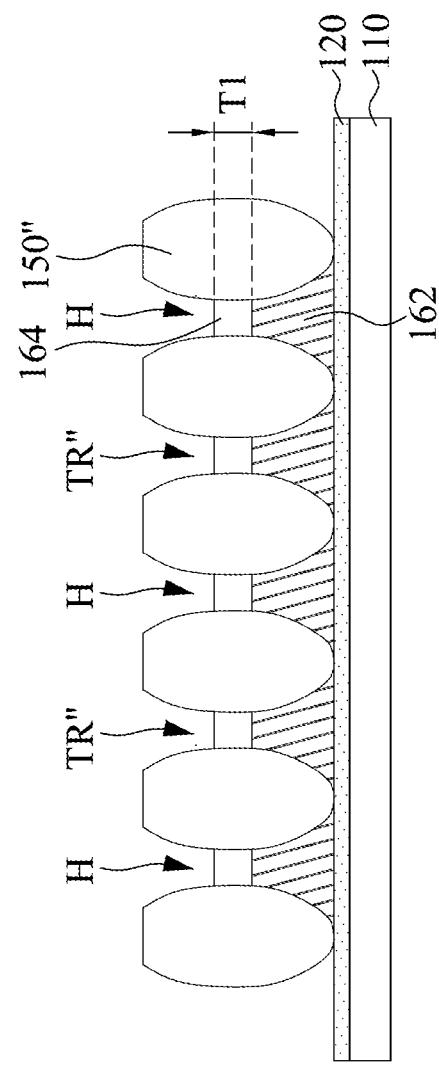
Figure 11C:
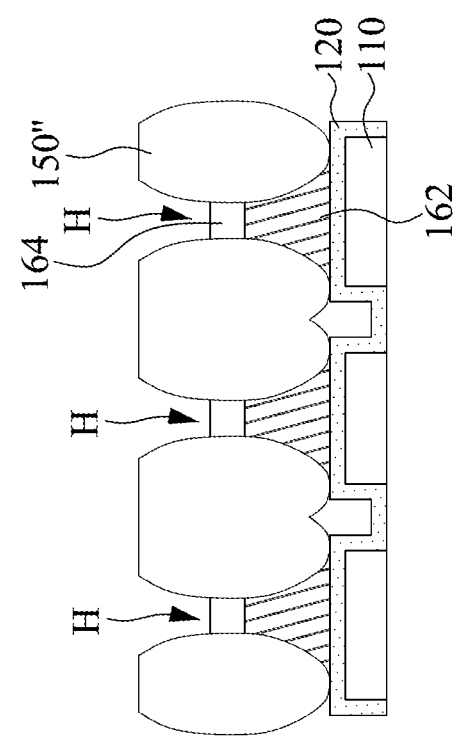

FIG. 11A is a top view of the electrical fuse matrix 100 in FIG. 1A at a mediate stage of a fabrication method of the electrical fuse matrix 100. FIG. 11B is a cross-sectional view of the electrical fuse matrix 100 taken along lines 11B-11B in FIG. 11A. FIG. 11C is a cross-sectional view of the electrical fuse matrix 100 taken along line 11C-11C in FIG.

11A. Reference is made to FIGS. 11A, 11B, and 11C simultaneously. After the deposition process, a planarization process and an etching back process are performed such that the thickness T1 of the dielectric layer 164M is reduced to about 30 angstroms to 100 angstroms. As such, the dielectric films 164 are formed in the trenches TR" and the holes H.

Figure 12A:
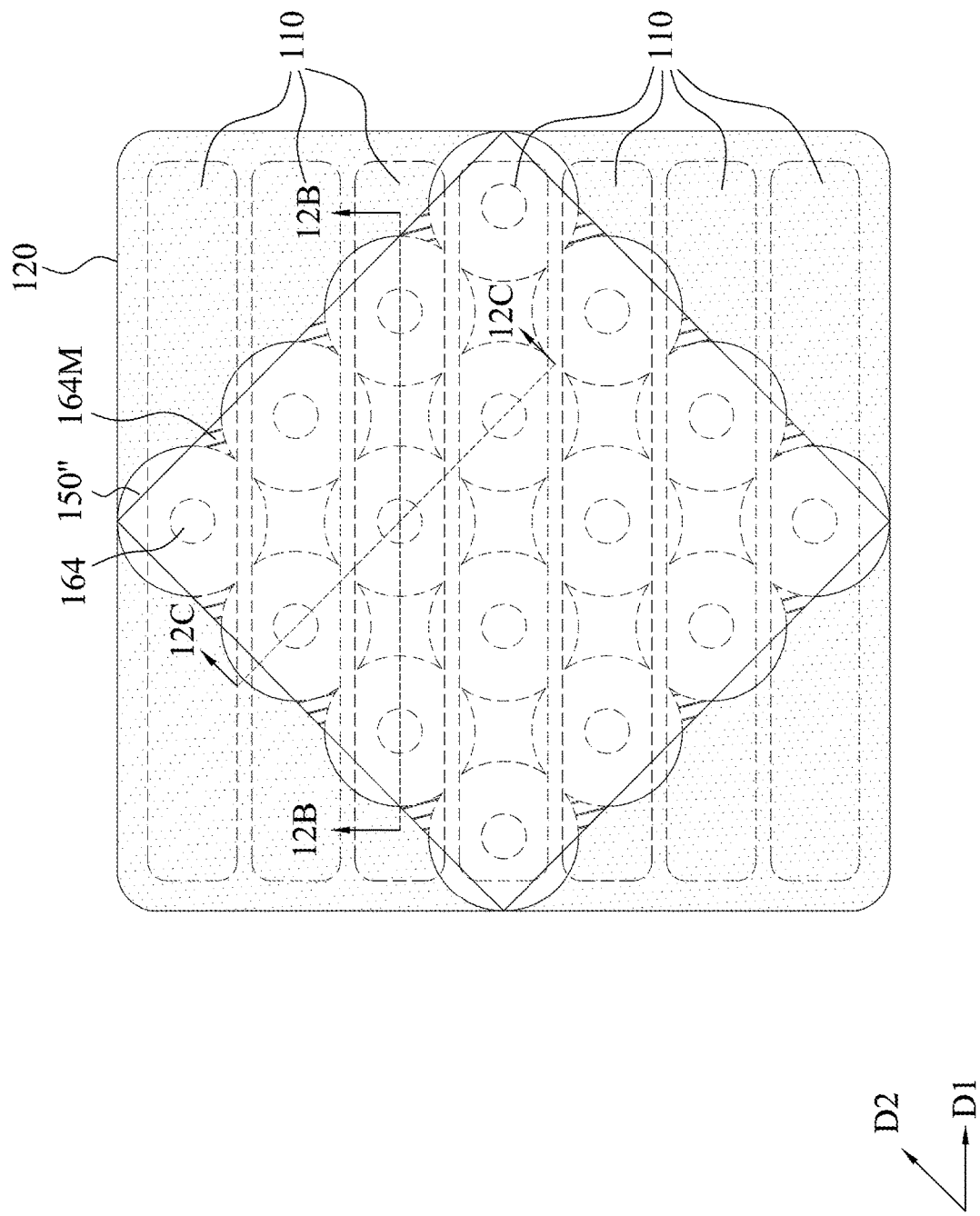

FIG. 12A is a top view of the electrical fuse matrix 100 in FIG. 1A at a mediate stage of a fabrication method of the electrical fuse matrix 100. FIG. 12B is a cross-sectional view of the electrical fuse matrix 100 taken along lines 12B-12B in FIG. 12A. FIG. 12C is a cross-sectional view of the electrical fuse matrix 100 taken along line 12C-12C in FIG. 12A. Reference is made to FIGS. 12A, 12B, and 12C simultaneously. A metal layer 166M is formed on the dielectric films 164 and the spacer 150" through metal plating. The metal layer 166M includes metal such as Cu, W, or metal alloy. Top surface of the spacer 150" is covered by the metal layer 166M.

Figure 13A:
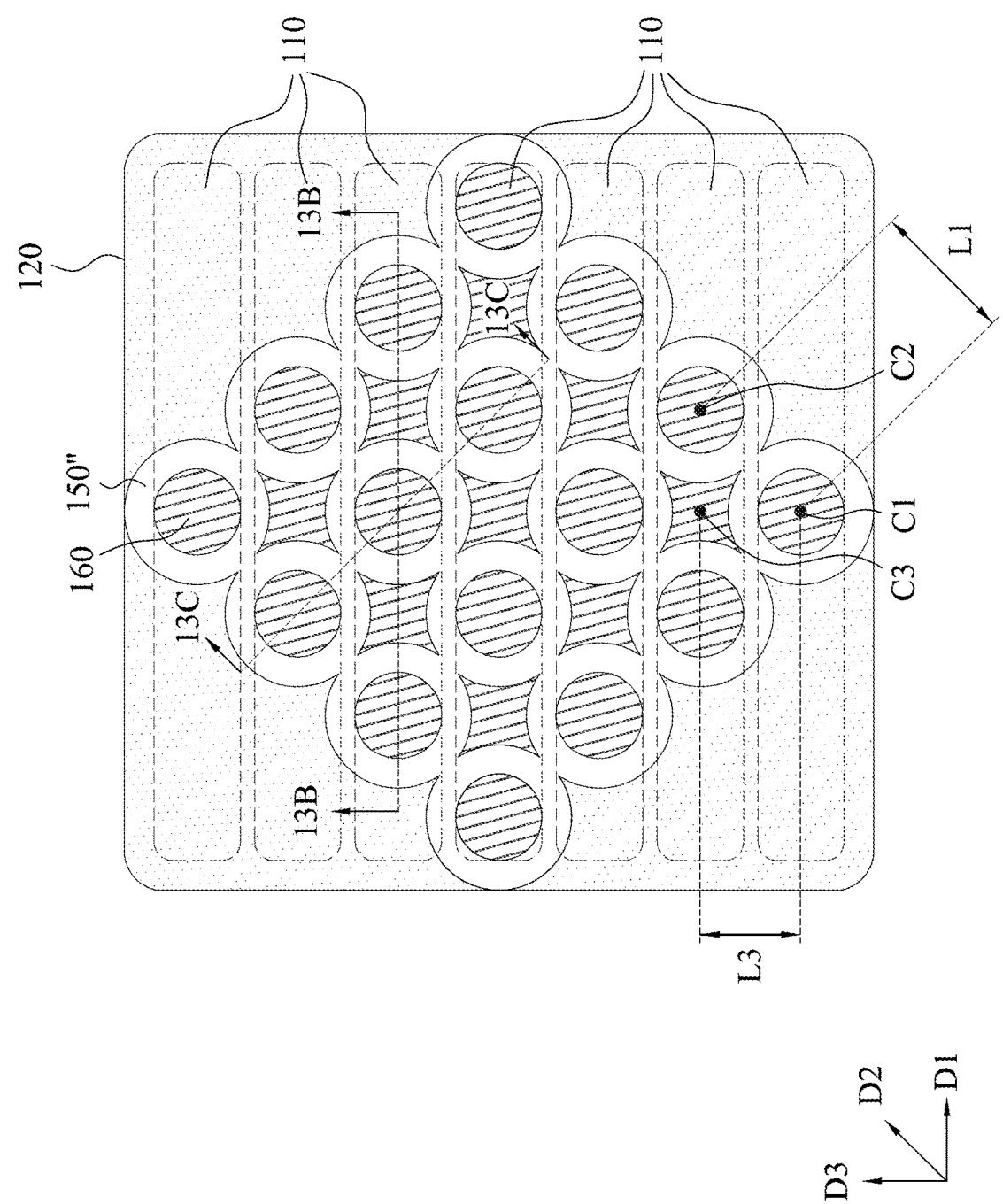
Figure 13B:
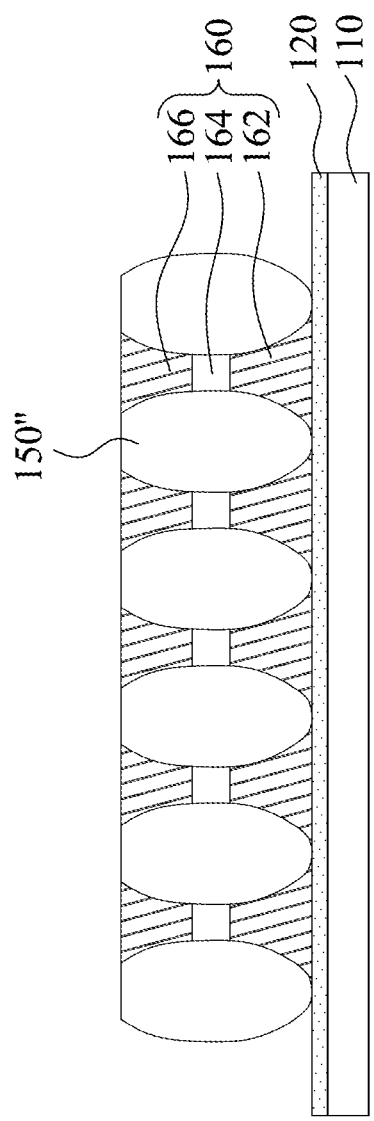
Figure 13C:
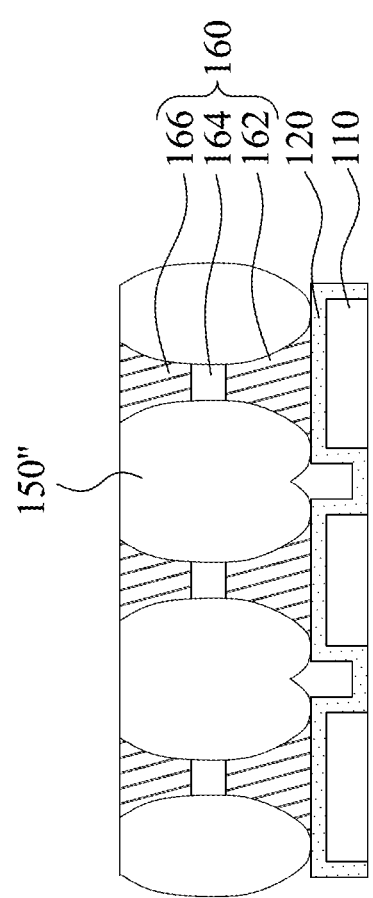

FIG. 13A is a top view of the electrical fuse matrix 100 in FIG. 1A at a mediate stage of a fabrication method of the electrical fuse matrix 100. FIG. 13B is a cross-sectional view of the electrical fuse matrix 100 taken along lines 13B-13B in FIG. 13A. FIG. 13C is a cross-sectional view of the electrical fuse matrix 100 taken along line 13C-13C in FIG. 13A. Reference is made to FIGS. 13A, 13B, and 13C simultaneously. After the metal plating process, a planarization process is performed such that the top surface of the spacer 150' is exposed from the metal layer 166M. As such, the top conductive structures 166 are formed in the trenches TR" and the holes H.

Reference is made to FIG. 4A and FIG. 13A. As shown in FIG. 4A, adjacent two of the poly-silicon cylinders 130 arranged along the second direction D2 have a distance L1 therebetween (illustrated by a distance between a center C1 and a center C2 of these two poly-silicon cylinders 130). A distance L2 is a component of the distance L1 along a third direction D3 perpendicular to the direction D1, and the distance L2 is smaller than the distance L1. Specifically, the distance L2 may be smaller than the resolution limit of the photo lithography method. That is, after performing the photo lithography method once, the poly-silicon cylinders 130 are arranged in a matrix, and each of the poly-silicon cylinders 130 are arranged along the direction D2 (see FIG. 1A) that are not perpendicular to the direction D1. As such, the distance L1 between adjacent two of the poly-silicon cylinders 130 are greater than the resolution limit of the photo lithography process. In other word, since the distance L2 is smaller than the resolution limit of the photo lithography method, the poly-silicon cylinders 130 may not arranged along the direction that is perpendicular to the first direction D1.

As shown in FIG. 13A, the anti-fuse structures 160 form a matrix, and a distance L3 between adjacent two anti-fuse structures 160 corresponds to the distance L2 in FIG. 4A. Specifically, the distance L3 is illustrated by a distance between the center C1 and a center C3 of adjacent two anti-fuse structures 160 that are arranged along the direction D3. That is, the distance L3 between adjacent two of the anti-fuse structures 160 is smaller than the resolution limit of a photolithography process. In other words, the pitch of the anti-fuse structures 100 may be smaller than the resolution limit of the photo lithography process by employing oxidation process with single photo lithography process. Accordingly, there is no need to use the photo lithography process twice or more time, such that the fabrication method of the electrical fuse matrix 100 may be simplified.

Figure 14A:
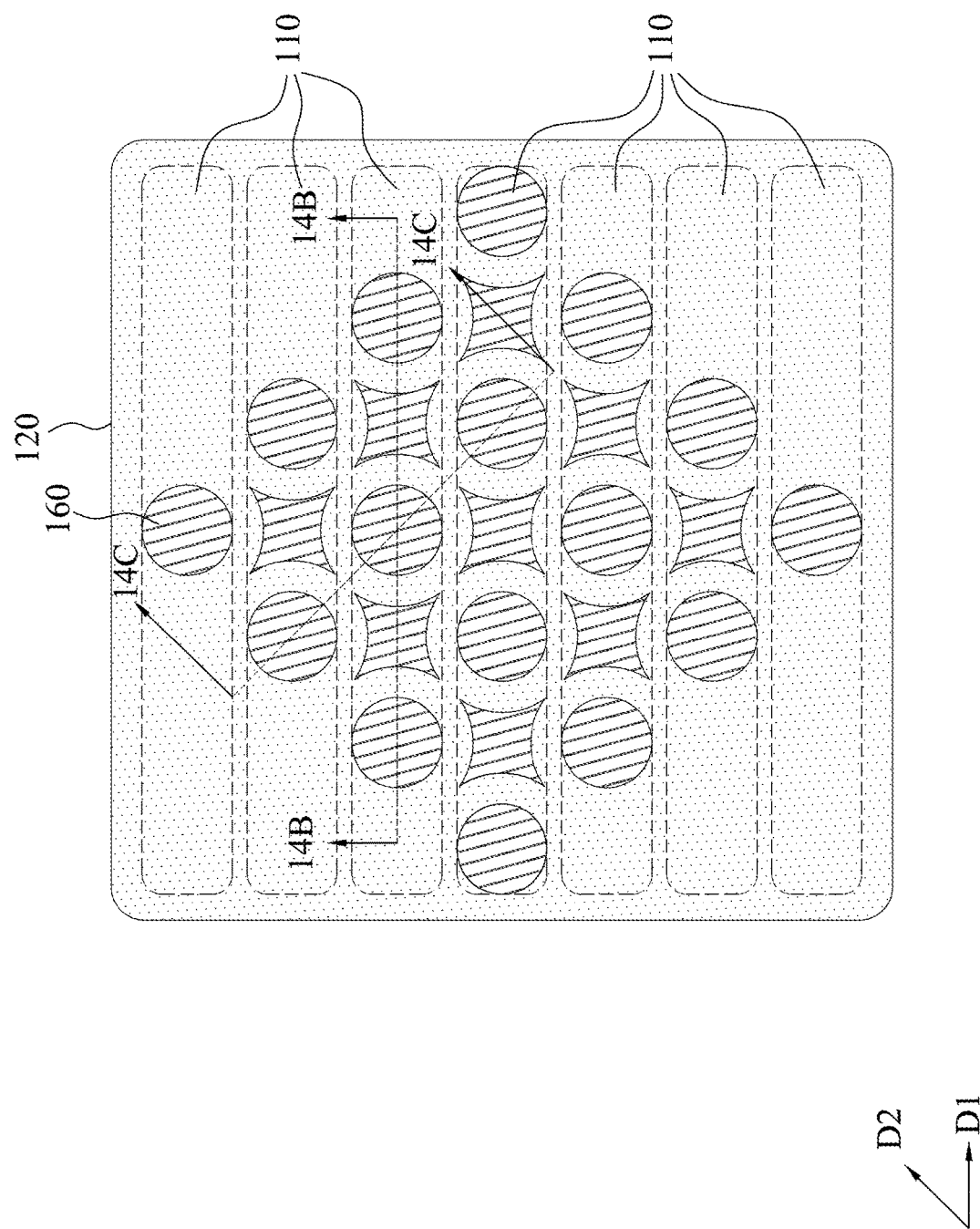
Figure 14B:
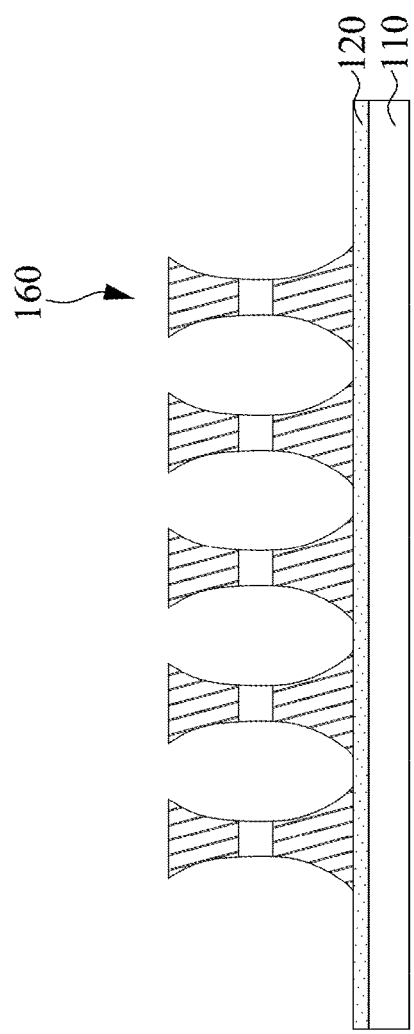
Figure 14C:
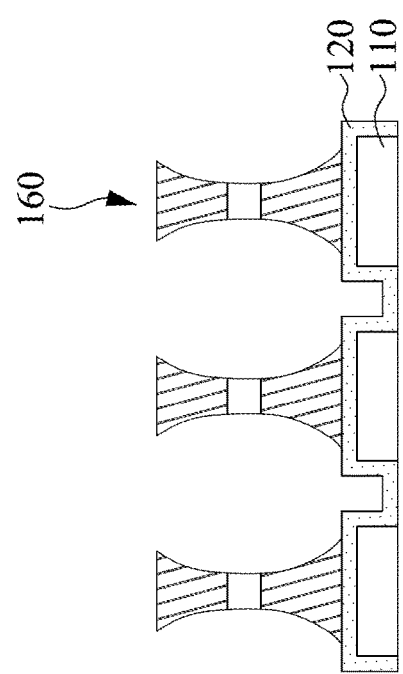

FIG. 14A is a top view of the electrical fuse matrix 100 in FIG. 1A at a mediate stage of a fabrication method of the electrical fuse matrix 100. FIG. 14B is a cross-sectional view of the electrical fuse matrix 100 taken along lines 14B-14B in FIG. 14A. FIG. 14C is a cross-sectional view of the electrical fuse matrix 100 taken along line 14C-14C in FIG. 14A. Reference is made to FIGS. 14A, 14B, and 14C simultaneously. After the anti-fuse structures 160 are formed, the spacer 150" is removed. Specifically, the first silicon oxide layer 152" and the second silicon oxide layer 154" are removed through stripping by using an etching solution containing hydrofluoric acid (HF. Therefore, the seed layer 120 is exposed from the anti-fuse structures 100.

Figure 15A:
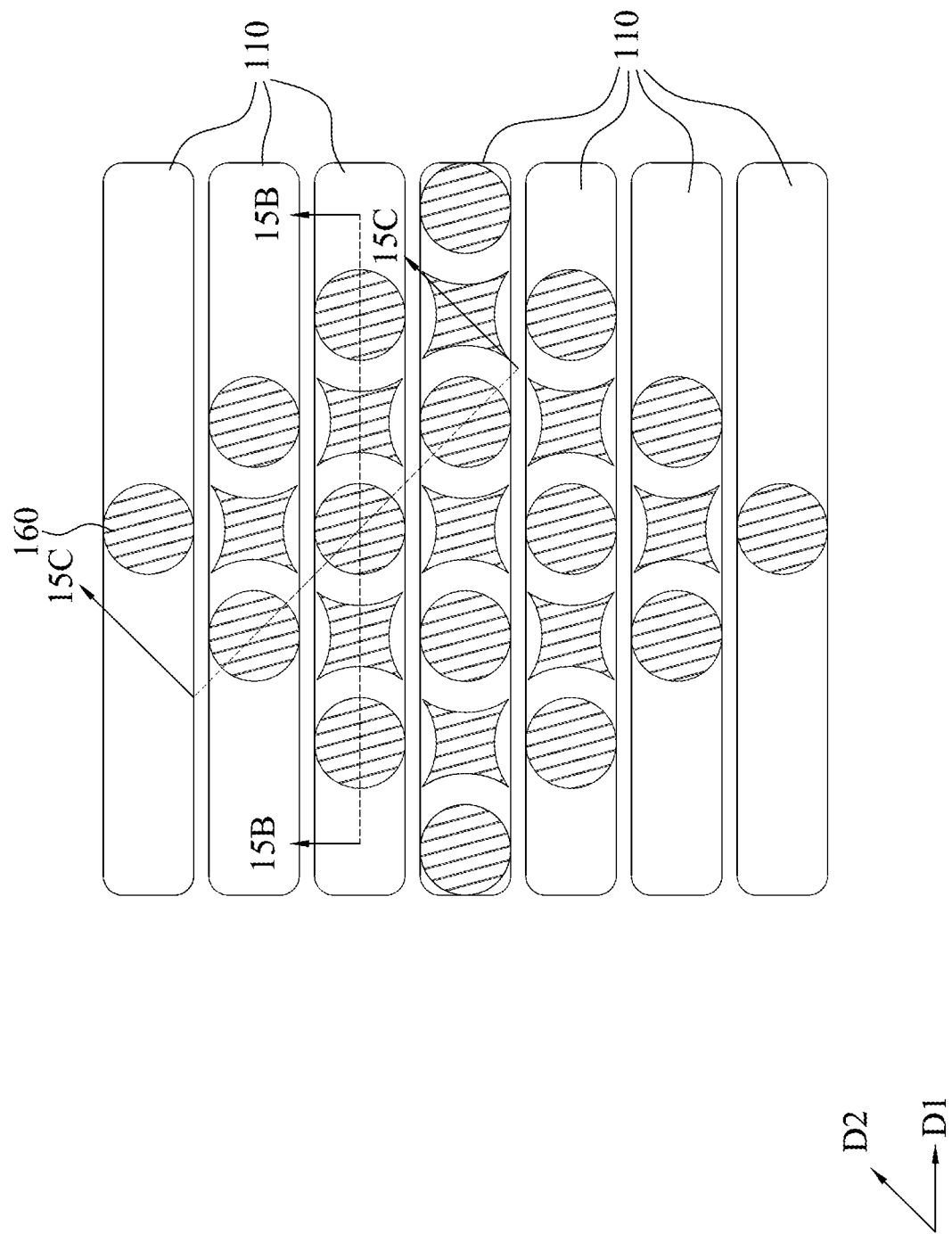
Figure 15B:
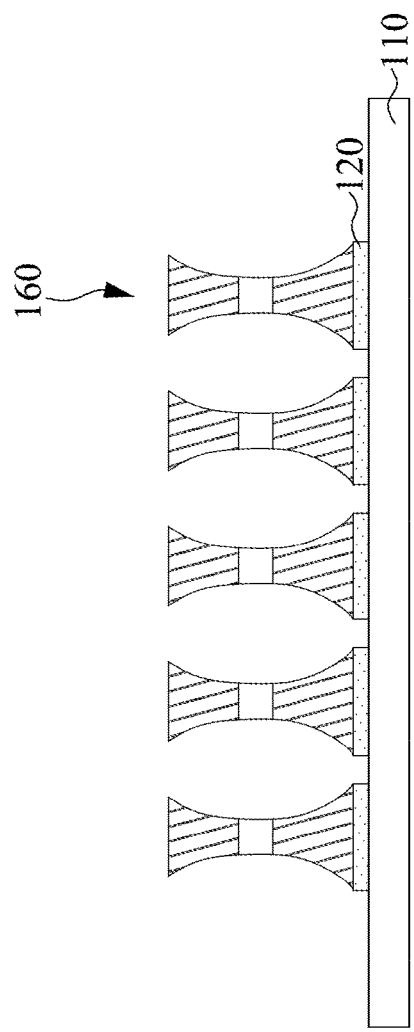
Figure 15C:
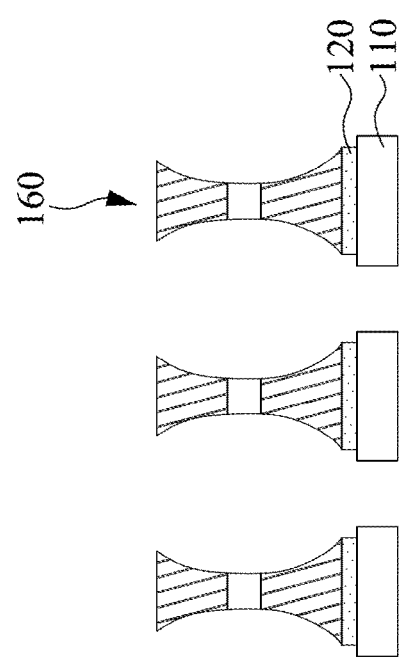

FIG. 15A is a top view of the electrical fuse matrix 100 in FIG. 1A at a mediate stage of a fabrication method of the electrical fuse matrix 100. FIG. 15B is a cross-sectional view of the electrical fuse matrix 100 taken along lines 15B-15B in FIG. 15A. FIG. 15C is a cross-sectional view of the electrical fuse matrix 100 taken along line 15C-15C in FIG. 15A. Reference is made to FIGS. 15A, 15B, and 15C simultaneously. The portions of the seed layer 120 exposed from the anti-fuse structures 100 are removed through stripping by using an $H_2O_2$ based solution.

Figure 16A:
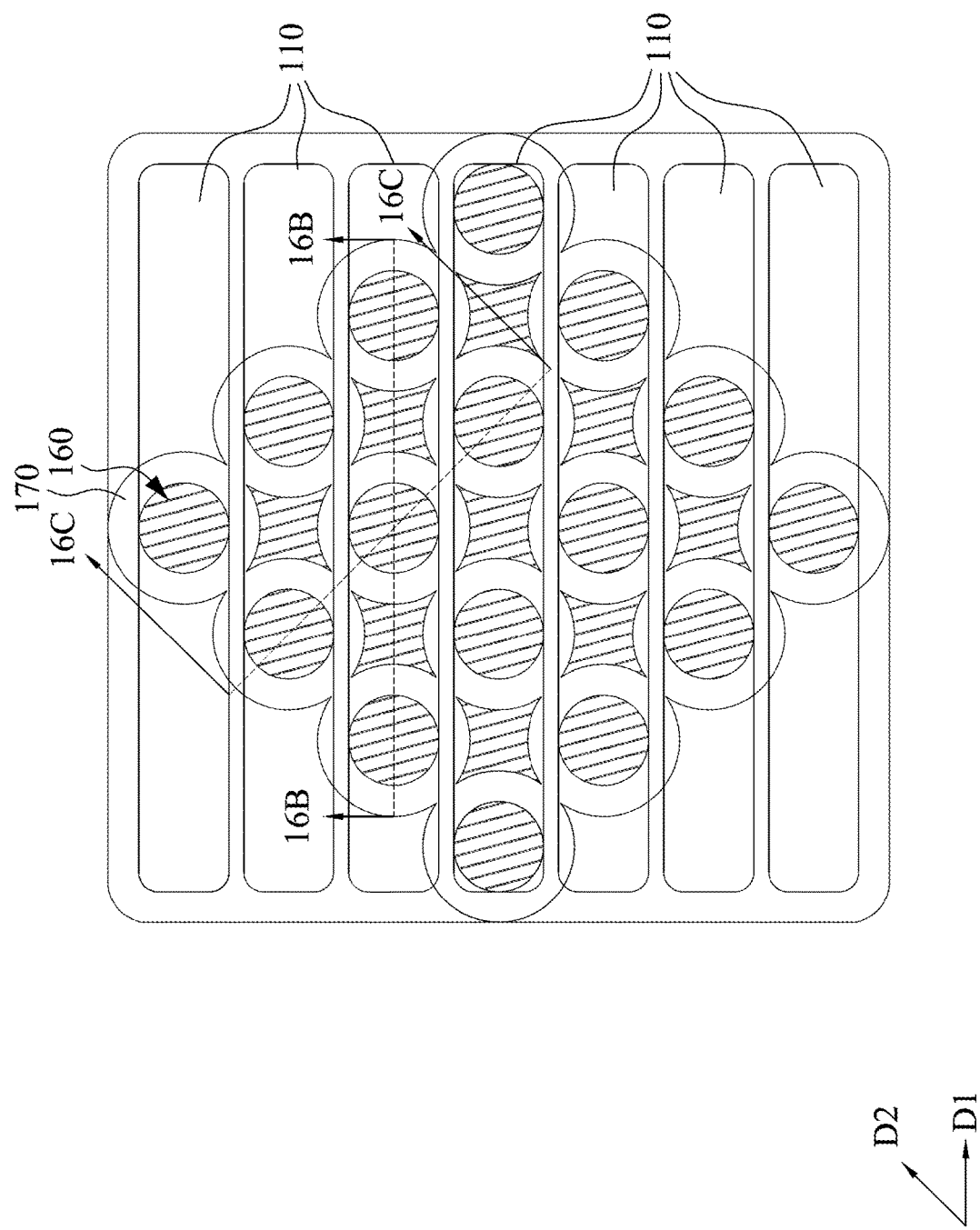
Figure 16B:
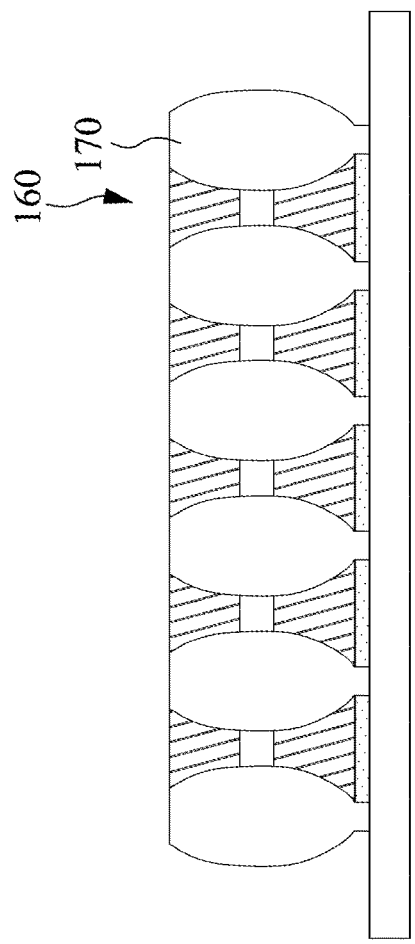
Figure 16C:
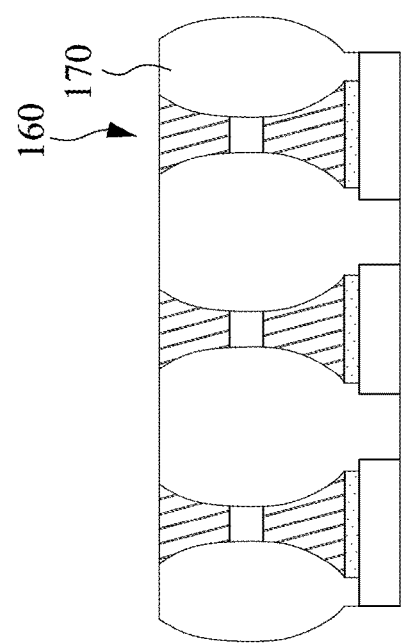

FIG. 16A is a top view of the electrical fuse matrix 100 in FIG. 1A at a mediate stage of a fabrication method of the electrical fuse matrix 100. FIG. 16B is a cross-sectional view of the electrical fuse matrix 100 taken along lines 16B-16B in FIG. 16A. FIG. 16C is a cross-sectional view of the electrical fuse matrix 100 taken along line 16C-16C in FIG. 16A. Reference is made to FIGS. 16A, 16B, and 16C simultaneously. An insulating layer 170 is filled to cover the bottom metal plates 110 and to surround the seed layer 120 and the anti-fuse structures 160. As such, the portions of the seed layer 120 underlying each of the anti-fuse structures 160 are separated from each other.

Reference is made to FIGS. 1A, 1B, and 1C. Top metal plates 180 are formed on the anti-fuse structures 100. The top metal plates 180 are formed through deposition and patterning. The top metal plates 180 may include metal such as Aluminum (Al), Tungsten (W), Copper (Cu), or combination thereof. The top metal plates 180 are parallel with each other and extend along the second direction D2. As such, when different voltages are applied on one of the bottom metal plates 110 and one of the top metal plates 180, a voltage difference is formed between the corresponding anti-fuse structure 100 that is located therebetween.

For example, as shown in FIG. 1B, a voltage difference E is applied on one of the anti-fuse structures 100 such that the anti-fuse structure 100 is blown out by selecting the corresponding top metal plate 180 and the corresponding bottom metal plate 110. In addition, since each of the anti-fuse structures 100 has an hourglass shape, and the cross section area and the thickness T1 of the dielectric film 164 are small, the anti-fuse structures 100 can be easily blown out once being selected.

The single lithography process, the poly-silicon oxidation process, and metal plating process as described above are the same as the traditional processes employed for fabricating a semiconductor device. In addition, the fabrication process of the anti-fuse structures 100 may follow a Complementary Metal Oxide Semiconductor (CMOS) process. Therefore, the fabrication process of the electrical fuse matrix 100 of the present disclosure can be combined with the traditional fabrication process.

As described above, the electrical fuse matrix of the present disclosure may provide an anti-fuse structures having hourglass shape, and the antifuse structures are arranged in a matrix. As such, the anti-fuse structure can be easily blown out by selecting the corresponding top metal plate and the corresponding bottom metal plate. Pitch of the anti-fuse structures may be smaller than the resolution limit of the photo lithography process by employing oxidation process with single photo lithography process. Accordingly, there is no need to use the photo lithography process twice or more time. In addition, the fabrication method of the electrical fuse matrix can be combined with the traditional fabrication process. Therefore, the fabrication method of the electrical fuse matrix may be simplified.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An electrical fuse matrix, comprising:
    a plurality of anti-fuse structures arranged in a matrix, wherein each of the anti-fuse structure comprises:
    a top conductive structure and a bottom conductive structure; and
    a dielectric film disposed between the top conductive structure and the bottom conductive structure, wherein the anti-fuse structure has an hourglass shape;
    a plurality of top metal plates disposed on the top conductive structures, a top plate of the plurality of top metal plates extending in a first direction from a top conductive structure of a first anti-fuse structure of the plurality of anti-fuse structures to a top conductive structure of a second anti-fuse structure of the plurality of anti-fuse structures;
    a plurality of bottom metal plates disposed on the bottom conductive structures, a bottom plate of the plurality of bottom metal plates extending in a second direction from a bottom conductive structure of the first anti-fuse structure of the plurality of anti-fuse structures to a bottom conductive structure of a third anti-fuse structure of the plurality of anti-fuse structures, the second direction is different from the first direction, wherein the second direction is not perpendicular to the first direction; and
    a seed layer electrically connected with the bottom metal plates and the bottom conductive structures, wherein a width of the seed layer is substantially the same as a width of a surface of the bottom conductive structure facing the seed layer, and the width of the seed layer is greater than a minimal width of the dielectric film.

2. The electrical fuse matrix of claim 1, wherein each of the top metal plates is electrically connected to at least one of the top conductive structures, and each of the bottom metal plates is electrically connected to at least one of the bottom conductive structures.

3. The electrical fuse matrix of claim 1, wherein a dimension of each of the dielectric films is smaller than dimensions of the top conductive structures and the bottom conductive structures.

4. The electrical fuse matrix of claim 1, wherein the minimal width of each of the dielectric films is in a range from about 8 nanometers to 15 nanometers.

5. The electrical fuse matrix of claim 1, wherein each of the dielectric films has a thickness located in a range from about 30 angstroms to 100 angstroms.

6. The electrical fuse matrix of claim 1, wherein each of the top conductive structures has a taper shape, and each of the bottom conductive structures has a taper shape.

7. The electrical fuse matrix of claim 1, wherein each of the top conductive structures has a surface connected with the top metal plate, each of the bottom conductive structures has a surface connected with the bottom metal plate, and widths of the surfaces of the top conductive structures and the bottom conductive structures are located in a range from about 30 nanometers to 40 nanometers.

8. The electrical fuse matrix of claim 1, further comprising an insulating layer surrounding the anti-fuse structures and the seed layer.

* * * * *